US008418111B2

(12) United States Patent
Chen et al.

(10) Patent No.: US 8,418,111 B2
(45) Date of Patent: Apr. 9, 2013

(54) METHOD AND APPARATUS FOR ACHIEVING MULTIPLE PATTERNING TECHNOLOGY COMPLIANT DESIGN LAYOUT

(75) Inventors: Huang-Yu Chen, Zhudong Township, Hsinchu County (TW); Fang-Yu Fan, Hukou Township, Hsinchu County (TW); Yuan-Te Hou, Hsinchu (TW); Lee-Chung Lu, Taipei (TW); Ru-Gun Liu, Hsinchu (TW); Ken-Hsien Hsieh, Taipei (TW); Lee Fung Song, Banciao (TW); Wen-Chun Huang, Tainan County (TW); Li-Chun Tien, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 217 days.

(21) Appl. No.: 12/953,661

(22) Filed: Nov. 24, 2010

(65) Prior Publication Data
US 2012/0131528 A1 May 24, 2012

(51) Int. Cl.
G06F 17/50 (2006.01)
(52) U.S. Cl.
USPC .............................. 716/126; 716/119; 716/139
(58) Field of Classification Search .................. 716/119, 716/126, 139
See application file for complete search history.

(56) References Cited

U.S. PATENT DOCUMENTS
8,239,806 B2 * 8/2012 Chen et al. .................... 716/126

OTHER PUBLICATIONS
Unpublished U.S. Appl. No. 12/649,979, filed Dec. 30, 2009 entitled, "Routing System and Method for Double Patterning Technology", 32 pages.

* cited by examiner

Primary Examiner — Thuan Do
(74) Attorney, Agent, or Firm — Haynes and Boone, LLP

(57) ABSTRACT

A method and apparatus for achieving multiple patterning compliant technology design layouts is provided. An exemplary method includes providing a routing grid having routing tracks; designating each of the routing tracks one of at least two colors; applying a pattern layout having a plurality of features to the routing grid, wherein each of the plurality of features corresponds with at least one routing track; and applying a feature splitting constraint to determine whether the pattern layout is a multiple patterning compliant layout. If the pattern layout is not a multiple patterning compliant layout, the pattern layout may be modified until a multiple patterning compliant layout is achieved. If the pattern layout is a multiple patterning compliant layout, the method includes coloring each of the plurality of features based on the color of each feature's corresponding at least one routing track, thereby forming a colored pattern layout, and generating at least two masks with the features of the colored pattern layout. Each mask includes features of a single color.

28 Claims, 12 Drawing Sheets

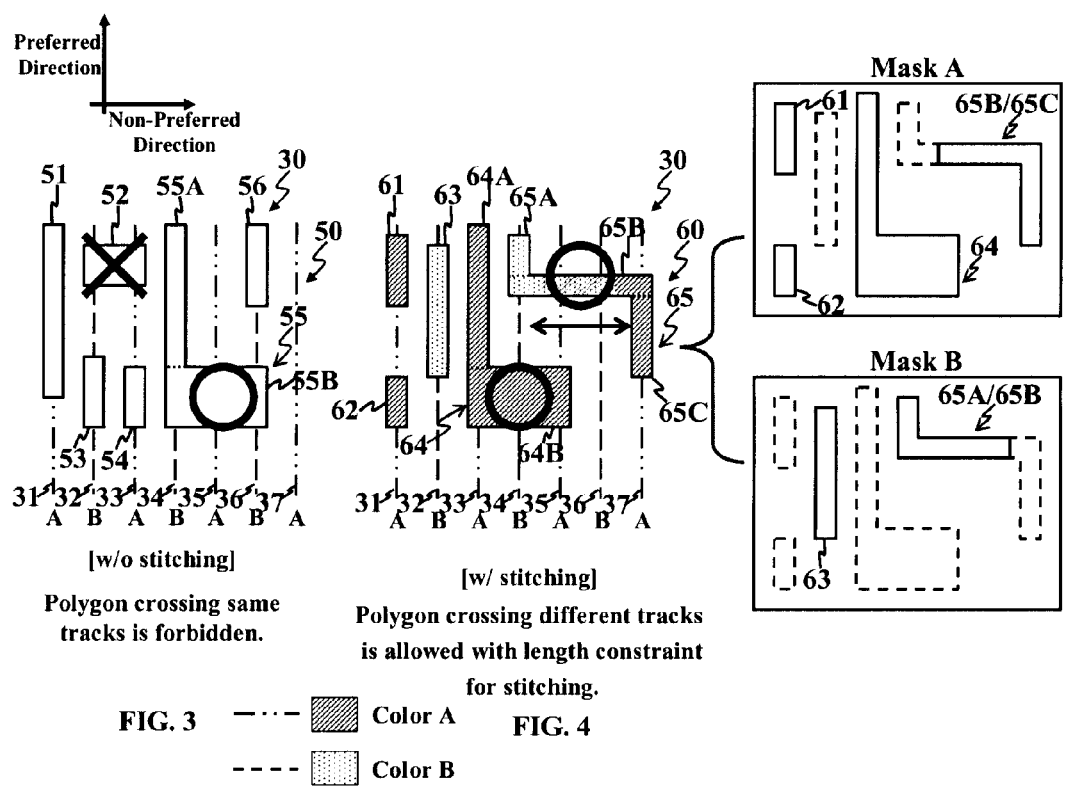

METHOD AND APPARATUS FOR ACHIEVING MULTIPLE PATTERNING TECHNOLOGY COMPLIANT DESIGN LAYOUT

BACKGROUND

Integrated circuit (IC) technologies are constantly being improved. Such improvements frequently involve scaling down device geometries to achieve lower fabrication costs, higher device integration density, higher speeds, and better performance. Photolithography is frequently used for forming components of an integrated circuit device. Generally, an exposure tool passes light through a photomask or reticle and focuses the light onto a photoresist layer of a wafer, resulting in the photoresist layer having an image of integrated circuit components therein. Printing device patterns with small spacings is limited by a minimum pitch printing resolution of the exposure tool. Double patterning technology (DPT) has thus been implemented to improve pattern resolution as device densities increase. DPT separates a pattern layout into two masks, essentially assigning some features of the pattern layout to one mask and the other features to another mask. Both masks are then used to transfer the pattern layout to a wafer, pushing the photolithography limit.

To achieve pattern layouts that are double patterning compliant, an exemplary DPT method assigns each feature of the pattern layout either a first color or a second color based on various DPT rules. Features assigned the first color are formed on a first mask, and features assigned the second color are formed on a second mask. The DPT rules implemented to decompose the pattern layouts are often complicated, and yet, it has been observed that pattern layouts generated may still not be DPT compliant. Some DPT methods specify that no stitching is allowed, which greatly sacrifices routing flexibility. Accordingly, although existing methods for achieving double patterning compliant pattern layouts have been generally adequate for their intended purposes, as device scaling down continues, they have not been entirely satisfactory in all respects.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 2-4 illustrate various pattern layouts that are evaluated according to the method of FIG. 1.

DETAILED DESCRIPTION

Figure 1:
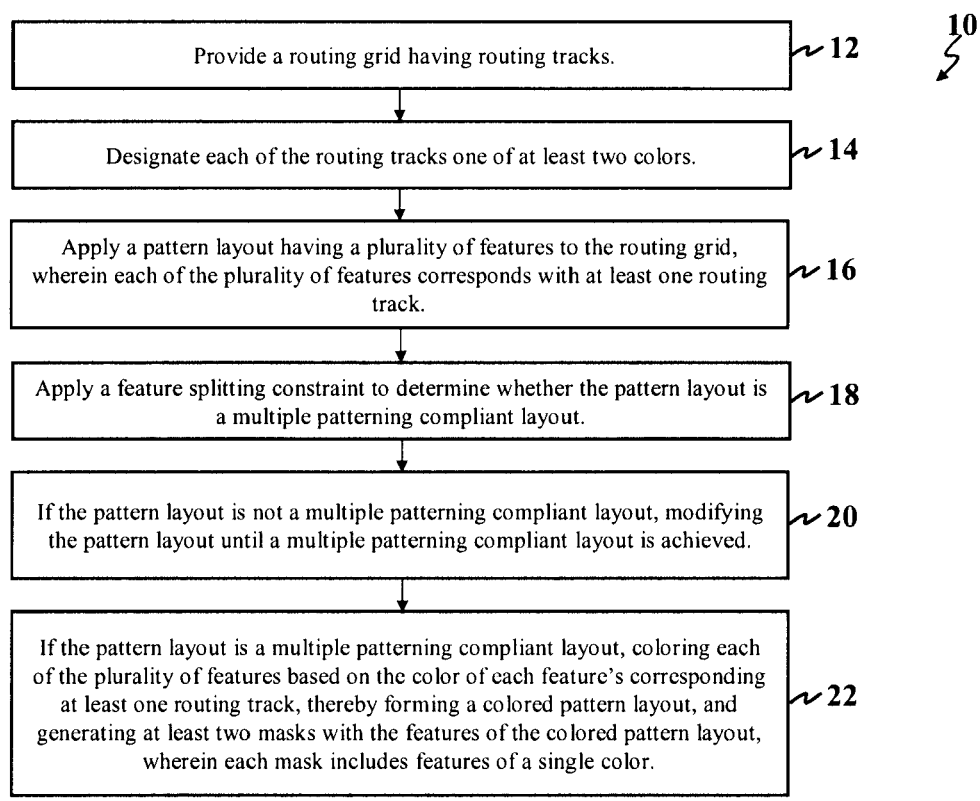
FIG. 1 is a flow chart of a method for achieving a multiple patterning compliant layout according aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

FIG. 1 is a flow chart of a method 10 for achieving multiple patterning compliant technology design layouts according to various aspects of the present disclosure. The method 10 begins at blocks 12 and 14 by providing a routing grid having routing tracks and designating each of the routing tracks one of at least two colors. In the depicted embodiment, the routing grid includes routing tracks oriented in a preferred direction. The routing grid may include routing tracks oriented in a non-preferred direction that is perpendicular to the preferred direction. At block 16, a pattern layout having a plurality of features is applied to the routing grid. Each of the plurality of features includes feature portions oriented in the preferred direction, feature portions oriented in the non-preferred direction, or feature portions oriented in both directions. When the pattern layout is applied to the routing grid, each of the plurality of features corresponds with at least one routing track. In some instances, a feature may be "off track" or "off grid", for example, a feature may be placed between two routing tracks, such as between two preferred routing tracks.

At block 18, a feature splitting constraint is applied to the pattern layout to determine whether the pattern layout is a multiple patterning layout. The feature splitting constraint evaluates the features of the pattern layout as applied to the routing grid, and may be applied in the preferred direction and/or non-preferred direction. For example, a feature splitting constraint applied in the preferred direction can evaluate spacing in the preferred direction between features within a same routing track. In another example, a feature splitting constraint applied in the non-preferred direction can evaluate a beginning and ending color of routing tracks occupied by a feature of the pattern layout to determine whether the feature presents a splitting issue. In another example, a feature splitting constraint applied in the non-preferred direction can evaluate a number of routing tracks occupied by a feature of the pattern layout to determine whether the feature presents a splitting issue. In an example, the feature splitting constraint specifies that no splitting is allowed in the preferred and/or non-preferred direction.

At block 20, if the pattern layout is not a multiple patterning compliant layout, the method 10 continues by modifying the pattern layout until a multiple patterning compliant layout is achieved. In an example, the pattern layout is redesigned to achieve a multiple patterning compliant layout. In another example, stitch insertions are applied to the pattern layout to achieve a multiple patterning compliant layout. Whether the pattern layout is redesigned or stitch insertions are applied to the pattern layout may depend on the feature splitting constraint. For example, the feature splitting constraint may indicate that no splitting or stitch insertions are allowed, in which case the pattern layout will be redesigned to achieve no splitting.

At block 22, if the pattern layout is a multiple patterning compliant layout, each of the plurality of features is colored based on the color of each feature's corresponding at least one routing track. For example, a feature that includes a single feature portion oriented in the preferred direction may correspond with a preferred routing track designated a first color, and accordingly, this feature will be assigned the first color. Another feature that includes a single feature portion oriented in the non-preferred direction may correspond with (in other words, occupy) more than one preferred routing track, and accordingly, this feature will be assigned a single color or multiple colors depending on the exact orientation of the feature. Then, at least two masks are generated with the features of the colored pattern layout. Each mask includes features of a single color. For example, if the features of the colored pattern layout are colored one of a first color and a second color, a first mask having features of the first color and a second mask having features of the second color are fabricated. Additional steps can be provided before, during, and after the method 10, and some of the steps described can be replaced or eliminated for other embodiments of the method. The discussion that follows illustrates various embodiments for achieving multiple patterning compliant technology design layouts according to the method 10 of FIG. 1.

Figure 2:
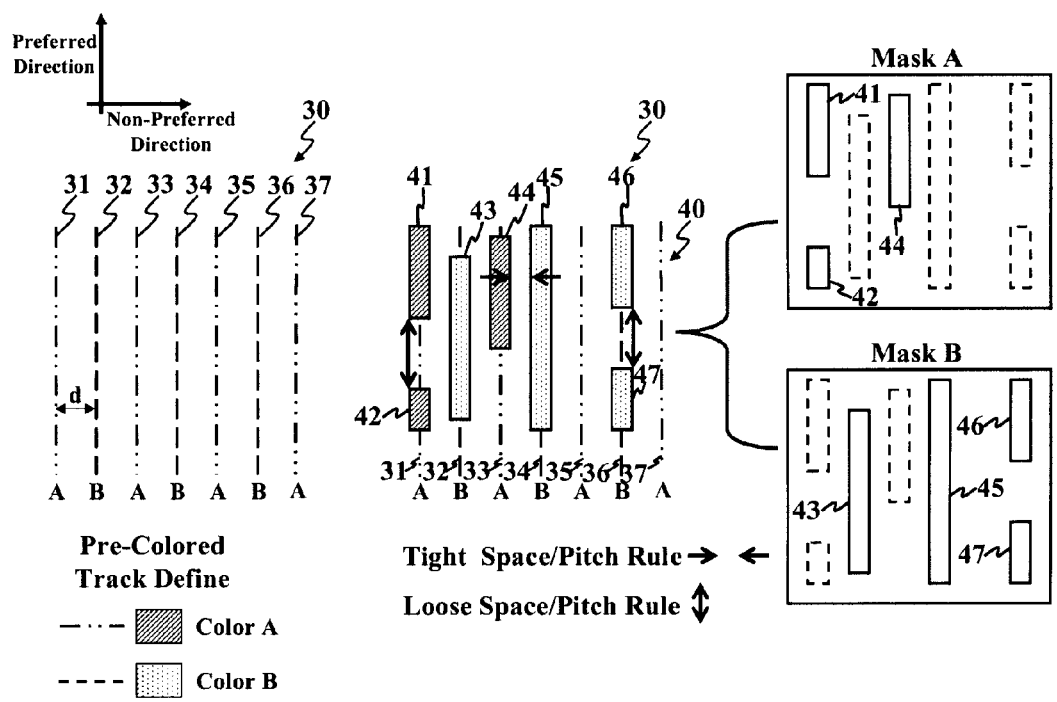

FIG. 2 illustrates a pattern layout that is a multiple patterning compliant layout according to the method 10 of FIG. 1. In FIG. 2, a routing grid 30 having routing tracks 31, 32, 33, 34, 35, 36, and 37 is provided. The routing tracks 31-37 are oriented parallel to one another, and are oriented (or extend) in a preferred direction, for example, vertically. A non-preferred direction is oriented perpendicular to the preferred direction, for example, horizontally. Each routing track 31-37 can represent a potential routing path for an integrated circuit device. In the depicted embodiment, each of the routing tracks 31-37 are spaced an equal distance from an adjacent routing track 31-37, respectively. For example, routing track 31 is spaced a distance, d, from adjacent routing track 32. The distance, d, provides sufficient space to place a feature (for example, a wire of an integrated circuit device) and any required spacing next to the feature. More specifically, the distance, d, may represent a minimum spacing rule (between features) plus a minimum width rule (for features).

Each of the routing tracks 31-37 is designated a color. For example, in the depicted embodiment, each routing track 31-37 is designated one of two colors, such as Color A and Color B. Starting with routing track 31, each routing track 31-37 is designated either Color A or Color B, such that no two adjacent routing tracks are the same color. In the depicted embodiment, every other routing track is designated the same color—routing tracks 31, 33, 35, and 37 are designated Color A, and routing tracks 32, 34, and 36 are designated Color B. Alternatively, the routing grid 30 may be defined with three colors, four colors, or any other number of colors depending on how many masks the pattern layout will be split (decomposed) into. For example, if the pattern layout will be split into three masks, each routing track 31-37 of the routing grid 30 may be designated one of three colors (Color A, Color B, and Color C), such that routing tracks 31, 34, and 37 are designated Color A, routing tracks 32 and 35 are designated Color B, and routing tracks 33 and 36 are designated Color C.

A pattern layout 40 is applied to the routing grid 30 having the color-defined routing tracks 31-37. The pattern layout 40 represents a layout of a portion of an integrated circuit device. Typically, an integrated circuit device is fabricated using multiple pattern layouts, each pattern layout defining a layer of the integrated circuit device. In the depicted embodiment, for simplicity and clarity, the examples herein will refer to a single pattern layout. However, the method 10 disclosed herein is intended to be implemented with all pattern layouts of the integrated circuit device. The pattern layout 40 can include a layout of integrated circuit devices, metal lines, via connections, trenches, other integrated circuit elements, or combinations thereof. The pattern layout (also referred to as a design layout) may be provided in a computer aided design (CAD) format, such as a GDS format. In the depicted embodiment, pattern layout 40 includes features (or patterns) 41, 42, 43, 44, 45, 46, and 47. The features 41-47 may be polysilicon gate lines, metal lines, contacts, trenches, other integrated circuit device features, or combinations thereof. The features 41-47 of the pattern layout 40 may be shaped as lines, line ends, contact holes, elbow shapes, T-shapes, L-shapes, Z-shapes, other suitable shapes, or combinations thereof. In the depicted embodiment, features 41-47 each include a single feature portion oriented in the preferred direction. In other words, each feature extends vertically, similar to routing tracks 31-37. Alternatively, the features 41-47 could include more than one feature portion, and the features 41-47 could include one or more feature portions oriented in the preferred direction, non-preferred direction, or both directions.

In the depicted embodiment, the pattern layout 40 is laid out relative to the routing grid 30, and specifically, routing tracks 31-37 defining where the various features 41-47 of the pattern layout 40 will be formed. Each of the features 41-47 corresponds with at least one of the routing tracks 31-37. For example, features 41 and 42 are oriented in the preferred direction and correspond with routing track 31. Put another way, features 41 and 42 occupy routing track 31. Considering the other features—feature 43 corresponds with (occupies) routing track 32, feature 44 corresponds with (occupies) routing track 33, feature 45 corresponds with (occupies) routing track 34, and features 46 and 47 correspond with (occupy) routing track 36. In the present example, no features correspond with routing tracks 35 and 37. As will be further discussed below, the features 41-47 can be colored based on the color of each feature's corresponding routing track or tracks, thereby providing a colored pattern layout. In the depicted embodiment, since features 41, 42, and 44 correspond with routing tracks 31 and 33, respectively, which are designated as Color A tracks, features 41, 42, and 44 are colored Color A. Similarly, since features 43, 45, 46, and 47 correspond with routing tracks 32, 34, and 36, respectively, which are designated as Color B tracks, features 43, 45, 46, and 47 are colored Color B. However, before coloring the various features, the pattern layout 40 is evaluated to determine whether it is a multiple patterning compliant based on its corresponding routing tracks.

More specifically, a feature splitting constraint is applied to the pattern layout 40 to determine whether the pattern layout is a multiple patterning compliant layout. The term "multiple patterning compliant layout" refers to a pattern layout that can be decomposed for multiple patterning technology—meaning that the pattern layout can be decomposed into multiple (at least two) sub-patterns, each sub-pattern being formed on a separate mask, such that the masks having the sub-patterns thereon may be used to recombine these sub-patterns to form the original pattern layout while manufacturing a portion of an integrated circuit device. In the depicted embodiment, the feature splitting constraint is based on a minimum spacing/pitch resolution of a lithography system. For a given lithography system, the minimum pitch, or minimum distance between adjacent features, must be complied with in order to prevent distortion when the features of the pattern layout are printed. The minimum pitch may include a minimum space between adjacent lines, a minimum space between line ends, a minimum pitch for adjacent contacts, or other appropriate spacing. In the depicted embodiment, the minimum pitch/spacing is referred to as a G0-space, or a splitting threshold value or decomposition criterion, which defines a minimum spacing allowed between adjacent features within a same mask. Adjacent features that have a smaller pitch or spacing than the G0-space are too close together, and such features will likely be distorted when printed in a photoresist layer during integrated circuit device manufacturing. Accordingly, these features will need to be decomposed into different masks. In the depicted embodiment, two adjacent features have a splitting constraint if their spacing is smaller than a given G0-space (splitting threshold).

Referring to FIG. 2, in the depicted embodiment, the feature splitting constraint includes a spacing constraint applied in the preferred direction and another spacing constraint applied in the non-preferred direction. For example, a relaxed space/pitch rule is applied in the preferred direction (in other words, to features within the same routing track), and a tight space/pitch rule is applied in the non-preferred direction (in other words, to features within different routing tracks). Assuming the G0-space, the minimum pitch/space, is represented by x, the loose (relaxed) space/pitch rule may define a minimum spacing between features within the same track as some value greater than ore equal to x (the G0-space), and the tight space/pitch rule may define a minimum spacing between features within different routing tracks as some value less than x (the G0-space). For example, to be a multiple patterning compliant layout, spacing between features within the same routing track must be greater than or equal to x by a threshold value, and spacing between features in different routing tracks can be less than x by the threshold value. In an example, the loose spacing (spacing between features within the same routing track) must be greater than or equal to x, and the tight spacing (spacing between features in different routing tracks) is about 0.4x. The threshold value may be a same or different value in the preferred and non-preferred directions. As noted above, the features 41-47 can be colored based on their corresponding routing tracks, and in the depicted embodiment, since the routing tracks 31-37 alternate between two colors, the features 41-47 will alternate between two colors, such that no two features in adjacent routing tracks will be colored the same, and thus will not be formed in the same mask. On the other hand, features within the same track will be colored the same, and thus, will be formed on the same mask. Accordingly, spacing between features in different routing tracks can be smaller than the specified G0-space, and spacing between features in the same routing tracks needs to be larger than or equal to the G0-space to ensure the features within the same routing track (in other words, the same mask) will not be distorted.

In the depicted embodiment, the space between features 41-47 comply with the space/pitch rules, and thus, the pattern layout 40 is colored and decomposed into two masks, where Color A features are formed on Mask A and Color B features are formed on Mask B. More specifically, in FIG. 2, features 41, 42, and 44 are designated as Color A and formed on Mask A, and features 43, 45, 46, and 47 are designated as Color B and formed on Mask B. The features 41-47 defined on the Masks A and B represent the pattern layout 40. The Masks A and B may be used to print an image of the pattern layout 40 into a photoresist layer during integrated circuit device manufacturing.

In FIG. 2, since features 41-47 were all oriented in the preferred direction, and each feature 41-47 occupied a single routing track, none of the features 41-47 presented feature decomposition/splitting issues. In other words, each feature 41-47 was formed on either Mask A or Mask B without having to decompose any features (where a portion of a feature would have been formed on Mask A and another portion of the feature would have been formed on Mask B). The following discussion turns to pattern layouts that present feature decomposition/splitting issues. The feature splitting constraint applied to the pattern layout to determine whether the pattern layout is a multiple patterning compliant layout may indicate whether feature stitching is allowed. In an example, the feature splitting constraint specifies that no stitching is allowed in the preferred and/or non-preferred direction, and thus, a pattern layout requiring any feature decomposition is not a multiple patterning compliant layout. This feature splitting constraint can be referred to as a no stitching constraint (FIG. 3). In this situation, a pattern layout having any features requiring decomposition will need to be modified until it is a multiple patterning compliant layout (in other words, a pattern layout that does not require stitching). In another example, the feature splitting constraint specifies that stitching is allowed in the preferred and/or non-preferred direction. In this situation, a pattern layout having any features requiring decomposition can be modified by inserting stitches into any feature requiring decomposition, such that it becomes a multiple patterning compliant layout. This feature splitting constraint can be referred to as a stitching constraint (FIG. 4). In these situations (FIGS. 2-4), the feature splitting constraint is based on a number of routing tracks occupied by a feature, or the beginning and ending colors of the routing tracks occupied by a feature. More specifically, as described in detail below, for each feature in a pattern layout, the number of routing tracks occupied by a feature, or the beginning and ending colors of the routing tracks occupied by the feature, are evaluated to determine whether the pattern layout requires any feature decomposition.

FIG. 3 illustrates a pattern layout that is not a multiple patterning compliant layout according to the method 10 of FIG. 1. In FIG. 3, the routing grid 30 having color-defined routing tracks 31-37 is provided, and a pattern layout 50 is applied to the routing grid 30 having color-defined routing tracks 31-37, such that features 51-56 of the pattern layout correspond with at least one of the routing tracks 31-37. The features 51-56 may be polysilicon gate lines, metal lines, contacts, trenches, other integrated circuit device features, or combinations thereof. The features 51-56 of the pattern layout 50 may be shaped as lines, line ends, contact holes, elbow shapes, T-shapes, L-shapes, Z-shapes, other suitable shapes, or combinations thereof. In the depicted embodiment, feature 51 is oriented in the preferred direction and corresponds with routing track 31, feature 53 is oriented in the preferred direction and corresponds with routing track 32, feature 54 is oriented in the preferred direction and corresponds with routing track 33, and feature 56 is oriented in the preferred direction and corresponds with routing track 36. Feature 52 includes a single feature portion oriented in the non-preferred direction that corresponds with routing tracks 32 and 33. Feature 55 corresponds with routing tracks 34-36. More particularly, feature 55 includes a feature portion 55A oriented in the preferred direction that corresponds with routing track 34, and a feature portion 55B oriented in the non-preferred direction that corresponds with routing tracks 34, 35, and 36.

In the depicted embodiment, a feature splitting constraint specifies no feature splitting for a multiple patterning compliant layout. The feature splitting constraint determines whether the pattern layout 50 requires any feature splitting based on the number of routing tracks occupied by a feature, or the beginning and ending colors of the routing tracks occupied by the feature. For example, the feature splitting constraint applied to the pattern layout 50 specifies that features that begin and end on routing tracks of the same color are allowed (in other words, these features do not require splitting), and features that begin and end on routing tracks of different colors are not allowed (in other words, these features require splitting). Referring to FIG. 3, whether any of the features 51-56 of the pattern layout 50 need splitting is thus determined by evaluating the colors of the features' beginning and ending routing tracks. For example, features 51, 53, 54, and 56 each occupy a single routing track of a single color, thus no splitting is required. Feature 55 occupies three routing tracks, routing tracks 34-36, where the beginning routing track 34 and ending routing track 36 are the same color, Color B. Since feature 55 begins and ends on routing tracks of the same color, feature 55 will not require splitting for pattern decomposition. In contrast, feature 52 occupies two routing tracks, routing tracks 32 and 33, where beginning routing track 32 (Color B) and ending routing track 33 (Color A) are different colors. This indicates that feature 52 will require splitting to obtain a multiple patterning compliant layout. Accordingly, since the feature splitting constraint applied to pattern layout 50 of FIG. 3 specifies no splitting (or no stitching), the pattern layout 50 fails to qualify as a multiple patterning compliant layout. The pattern layout 50 can be modified until it complies with the no splitting/stitching constraint, such that a multiple patterning compliant layout is achieved, and the pattern layout 50 can be decomposed into more than one mask.

FIG. 4 illustrates a pattern layout that is a multiple patterning compliant layout according to the method 10 of FIG. 1. In FIG. 4, the routing grid 30 having color-defined routing tracks 31-37 is provided, and a pattern layout 60 is applied to the routing grid 30 having color-defined routing tracks 31-37, such that features 61-65 of the pattern layout 60 correspond with at least one of the routing tracks 31-37. The features 61-65 may be polysilicon gate lines, metal lines, contacts, trenches, other integrated circuit device features, or combinations thereof. The features 61-65 of the pattern layout 60 may be shaped as lines, line ends, contact holes, elbow shapes, T-shapes, L-shapes, Z-shapes, other suitable shapes, or combinations thereof. In the depicted embodiment, features 61 and 62 are oriented in the preferred direction and correspond with routing track 31, and feature 63 is oriented in the preferred direction and corresponds with routing track 32. Feature 64 includes a feature portion 64A oriented in the preferred direction that corresponds with routing track 33, and a feature portion 64B oriented in the non-preferred direction that corresponds with routing tracks 33, 34, and 35. Feature 64 thus begins at routing track 33 and ends at routing track 35. Feature 65 includes feature portions 65A, 65B, and 65C. Feature portions 65A and 65C are oriented in the preferred direction and correspond with routing tracks 34 and 37, respectively. Feature portion 65B is oriented in the non-preferred direction and corresponds with routing tracks 34, 35, 36, and 37. Feature portion 65 thus begins at routing track 34 and ends at routing track 37.

In the depicted embodiment, a feature splitting constraint specifies that feature splitting is allowed in the non-preferred direction for a multiple patterning compliant layout. Similar to the feature splitting constraint described above with reference to FIG. 3, the feature splitting constraint determines whether the pattern layout 60 requires any feature splitting based on the number of routing tracks occupied by a feature, or the beginning and ending colors of the routing tracks occupied by the feature. For example, the feature splitting constraint applied to the pattern layout 60 specifies that features that begin and end on routing tracks of the same color require do not require splitting, and features that begin and end on routing tracks of different colors require splitting. In contrast to the feature splitting constraint described with reference to FIG. 3, in the depicted embodiment, feature splitting is allowed in the non-preferred direction. Referring to FIG. 4, whether any of the features 61-65 of the pattern layout 60 need splitting is thus determined by evaluating the colors of the features' beginning and ending routing tracks. Features 61, 62, and 63 each occupy a single routing track of a single color, thus no splitting is required. Feature 64 occupies three routing tracks, routing tracks 33-35, where the beginning routing track 33 and ending routing track 35 are the same color, Color A. Since feature 64 begins and ends on routing tracks of the same color, feature 64 will not require splitting for pattern decomposition. In contrast, feature 65 occupies four routing tracks, routing tracks 34-37, where beginning routing track 34 (Color B) and ending routing track 37 (Color A) are different colors. This indicates that feature 65 will require splitting to obtain a multiple patterning compliant layout. Since the feature splitting constraint applied to pattern layout 60 of FIG. 4 specifies that splitting is allowed in the non-preferred direction, the pattern layout 60 qualifies as a multiple patterning compliant layout if stitches are inserted into the feature requiring splitting. The pattern layout 60 can be modified by inserting stitches into the feature portion 65B oriented in the non-preferred direction of feature 65, such that a multiple patterning compliant layout is achieved, and the pattern layout 60 can be decomposed into more than one mask.

The features 61-65 are then colored based on the color of each feature's corresponding routing track or tracks. Since features 61 and 62 correspond with routing track 31, (designated as Color A tracks), features 61 and 62 are colored Color A. Since feature 63 corresponds with routing track 32 (designated as Color B tracks), feature 63 is colored Color B. Since feature 64 does not require splitting, it is designated the color of its corresponding beginning and ending routing tracks, Color A. As noted above, feature 65 begins and ends on routing tracks of different colors (beginning on Color B routing track 34 and ending on Color A routing track 37), and thus requires splitting. Since the feature splitting constraint specifies that splitting is allowed in the non-preferred direction, a portion of the feature 65 is colored Color B, the color of its beginning routing track 34, and another portion of the feature 65 is colored Color A, the color of its ending routing track 37. More specifically, since feature portions 65A and 65C respectively correspond with routing tracks 34 and 37 (designated as Color B and Color A, respectively), feature portion 65A is colored Color B and feature portion 65B is colored Color A. Feature portion 65B begins on the routing track 34 of Color A and ends on the routing track 37 of Color B, and thus, feature portion 65B is colored both Colors A and B as illustrated in FIG. 4. The colored Color A and Color B portions of feature portion 65B overlap one another to incorporate the stitch.

The colored pattern layout 60 is then decomposed into two masks, where Color A features are formed on Mask A and Color B features are formed on Mask B. More specifically, in FIG. 4, feature 61, feature 62, feature 64, and a portion of feature 65 are designated as Color A and formed on Mask A. Features 63 and a portion of feature 65 are designated as Color B and formed on Mask B. The features 61-65 defined on the Masks A and B represent the pattern layout 60. The Masks A and B may be used to print an image of the pattern layout 60 into a photoresist layer during integrated circuit device manufacturing.

Referring to FIGS. 3 and 4, instead of focusing on the color of a feature's corresponding beginning and ending routing tracks, a number of routing tracks occupied by each feature may be evaluated to quickly determine if any pattern features will require splitting. For example, in FIGS. 3 and 4, where the routing tracks are designated one of two colors, a rule may be applied that specifies the features can occupy odd numbers of routing tracks, but not even numbers of routing tracks. For example, from FIGS. 3 and 4, features 52 and 65 occupy even numbers of routing tracks (two and four, respectively). This indicates that these features will require splitting. On the other hand, features 55 and 64 occupy odd numbers of routing tracks (three), indicating that these features will not require splitting. Features 51, 53, 54, 56, 61, 62, and 63 also occupy an odd number of routing tracks (one), indicating that these features also will not require splitting. From this, where the feature splitting constraint indicates no splitting, it is quickly determined that pattern layout 50 is not a multiple patterning compliant layout (since feature 52 occupies an even number of routing tracks). On the other hand, where the feature splitting constraint allows splitting, it is quickly determined which features of the pattern layout 60 will require splitting and stitching (feature 65 needs splitting and stitching since it occupies an even number of routing tracks). As the number of colors designated to the routing tracks increases, a relationship between the number of colors and splitting can be determined to apply to the pattern layouts when evaluating multiple patterning compliance.

Figure 5:
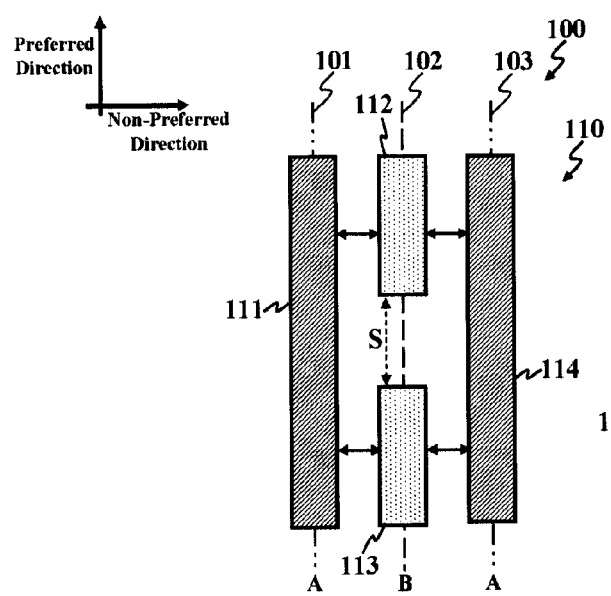

FIGS. 5-8 illustrates pattern layouts that are multiple patterning compliant layouts according to the method 10 of FIG. 1 based on various feature splitting constraints. Referring to FIG. 5, a feature splitting constraint specifies that feature splitting is not allowed in a preferred direction. In FIG. 5, a routing grid 100 having routing tracks 101, 102, and 103 is provided. The routing tracks 101-103 are oriented parallel to one another, and are oriented (or extend) in a preferred direction, for example, vertically. A non-preferred direction is oriented perpendicular to the preferred direction, for example, horizontally. Each routing track 101-103 can represent a potential routing path for an integrated circuit device. In the depicted embodiment, each of the routing tracks 101-103 are spaced an equal distance from an adjacent routing track 101-103, respectively. Each routing track is spaced a distance away from each adjacent routing track by a minimum spacing rule (between features) plus a minimum width rule (for features). Each of the routing tracks 101-103 is designated a color. For example, in the depicted embodiment, each routing track 101-103 is designated one of two colors, such as Color A and Color B. Starting with routing track 101, each routing track 101-103 is designated either Color A or Color B, such that no two adjacent routing tracks are the same color. In the depicted embodiment, every other routing track is designated the same color—routing tracks 101 and 103 are designated Color A, and routing track 102 is designated Color B. Alternatively, the routing grid 100 may be defined with three colors, four colors, or any other number of colors depending on how many masks the pattern layout will be decomposed into.

A pattern layout 110 is applied to the routing grid 100 having the color-defined routing tracks 101-103. The pattern layout 110 represents a layout of a portion of an integrated circuit device. Typically, an integrated circuit device is fabricated using multiple pattern layouts, each pattern layout defining a layer of the integrated circuit device. In the depicted embodiment, for simplicity and clarity, the examples herein will refer to a single pattern layout. However, the method 10 disclosed herein is intended to be implemented with all pattern layouts of the integrated circuit device. The pattern layout 110 can include a layout of integrated circuit devices, metal lines, via connections, trenches, other integrated circuit elements, or combinations thereof. The pattern layout (also referred to as a design layout) may be provided in a computer aided design (CAD) format, such as a GDS format. In the depicted embodiment, pattern layout 110 is a one-dimensional layout, including features (or patterns) 111, 112, 113, and 114. The features 111-114 may be polysilicon gate lines, metal lines, contacts, trenches, other integrated circuit device features, or combinations thereof. The features 111-114 of the pattern layout 110 may be shaped as lines, line ends, contact holes, elbow shapes, T-shapes, L-shapes, Z-shapes, other suitable shapes, or combinations thereof. In the depicted embodiment, features 111-114 each include a single feature portion oriented in the preferred direction. In other words, each feature extends vertically, similar to routing tracks 101-103. Alternatively, the features 111-114 could include more than one feature portion, and the features 111-114 could include one or more feature portions oriented in the preferred direction, non-preferred direction, or both directions.

In the depicted embodiment, the pattern layout 110 is laid out relative to the routing grid 100, and specifically, routing tracks 101-103 defining where the various features 111-114 of the pattern layout 100 will be formed. Each of the features 111-114 corresponds with at least one of the routing tracks 101-103. For example, feature 111 is oriented in the preferred direction and corresponds with routing track 101, features 112 and 113 correspond with routing track 102, and feature 114 corresponds with routing track 103.

As noted above, in the present example, a feature splitting constraint specifies that no feature splitting is allowed in the preferred direction for a multiple patterning compliant layout. More specifically, the feature splitting constraint specifies that there can be no G0-spaces in the preferred direction between features. Accordingly, the pattern layout 110 is evaluated to ensure that there are no G0-spaces in the preferred direction between features—spacings between features 111-114 in the preferred direction are evaluated to ensure that there are no G0-spaces in the preferred direction between features. For example, spacing S is evaluated between features 112 and 113 within the same routing track, which is larger than or equal to the G0-space in the present example. The pattern layout 110 is thus a multiple patterning compliant, since no feature splitting is required in the preferred direction. It should be noted that because features occupying adjacent routing tracks will be assigned to different masks (no two adjacent routing tracks will be designated the same color), G0-spaces are allowed in the non-preferred direction between adjacent features.

The features 111-114 are then colored based on the color of each feature's corresponding routing track or tracks. Features 111 and 114 correspond respectively with routing tracks 101 and 103 (designated as a Color A tracks), so features 111 and 114 are colored Color A. Features 112 and 113 correspond with routing track 102 (designated as a Color B track), so features 112 and 113 are colored Color B. The colored pattern layout 110 may be decomposed into two masks, where Color A features are formed on one mask and Color B features are formed on another mask. The masks may be used to print an image of the pattern layout 110 into a photoresist layer during integrated circuit device manufacturing.

Figure 6:
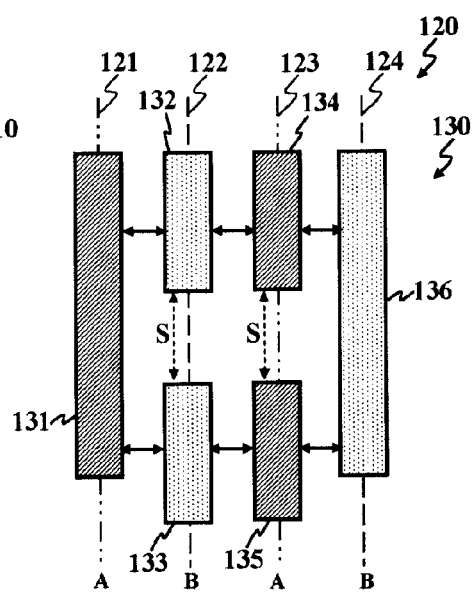
FIGS. 6-8 illustrate various pattern layouts that are multiple patterning compliant layouts according to the method of FIG. 1.

Referring to FIG. 6, a feature splitting constraint specifies that feature splitting is not allowed in a preferred direction. In FIG. 6, a routing grid 120 having color-defined routing tracks 121-124 is provided, and a pattern layout 130 is applied to the routing grid 120 having color-defined routing tracks 121-124, such that features 131-136 of the pattern layout 130 correspond with at least one of the routing tracks 121-124. The routing grid 120 having color-defined routing tracks 121-124 is similar to the routing grids described above, and the pattern layout 130 having features 131-136 is similar to the pattern layouts described above. In the depicted embodiment, feature 131 is oriented in the preferred direction and corresponds with routing track 121, features 132 and 133 are oriented in the preferred direction and correspond with routing track 122, features 134 and 135 are oriented in the preferred direction and correspond with routing track 123, and feature 136 is oriented in the preferred direction and corresponds with routing track 124.

In the depicted embodiment, a feature splitting constraint specifies that no feature splitting is allowed in the preferred direction for a multiple patterning compliant layout. More specifically, the feature splitting constraint specifies that there can be no G0-spaces in the preferred direction between features. Accordingly, the pattern layout 130 is evaluated to ensure that there are no G0-spaces in the preferred direction between features—spacings between features 131-136 in the preferred direction are evaluated. For example, spacing S is evaluated between features 132 and 133 within the same routing track 122, and spacing S is evaluated between features 134 and 135 within the same routing track 123. In the depicted embodiment, the spacings features 132 and 133, and features 134 and 135, are larger than or equal to the G0-space. The pattern layout 130 is thus a multiple patterning compliant.

The features 131-136 are then colored based on the color of each feature's corresponding routing track or tracks. Feature 131 corresponds with routing track 121 (designated as a Color A track), so feature 131 is colored Color A. Features 132 and 133 correspond with routing track 122 (designated as a Color B track), so features 132 and 133 are colored Color B. Features 134 and 135 correspond with routing track 123 (designated as a Color A track), so features 134 and 135 are colored Color A. Feature 136 corresponds with routing track 124 (designated as a Color B track), so feature 136 is colored Color B. The colored pattern layout 130 may be decomposed into two masks, where Color A features are formed on one mask and Color B features are formed on another mask. The masks may be used to print an image of the pattern layout 130 into a photoresist layer during integrated circuit device manufacturing.

Figure 7:
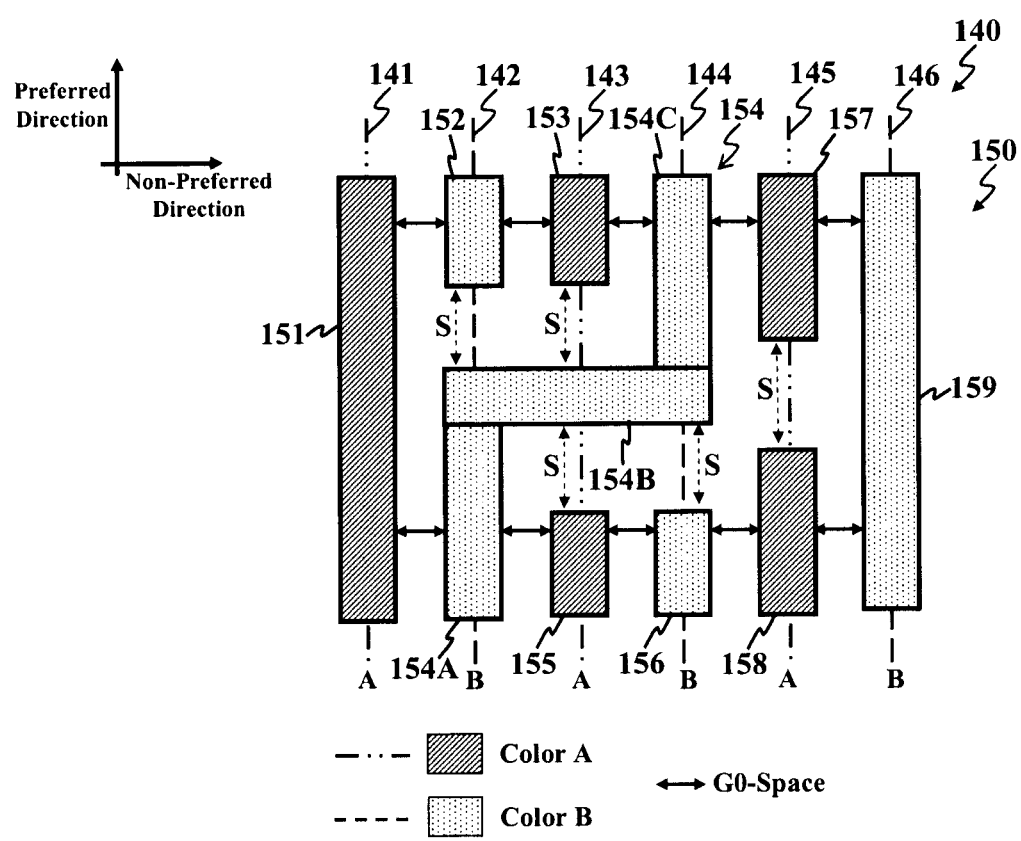

Referring to FIG. 7, a feature splitting constraint specifies that feature splitting is not allowed in a preferred direction or a non-preferred direction. In FIG. 7, a routing grid 140 having color-defined routing tracks 141-146 is provided. A pattern layout 150 is applied to the routing grid 140 having color-defined routing tracks 141-146, such that features 151-159 of the pattern layout 150 correspond with at least one of the routing tracks 141-146. The routing grid 140 having color-defined routing tracks 141-146 is similar to the routing grids described above, and the pattern layout 150 having features 151-159 is similar to the pattern layouts described above. In the depicted embodiment, the pattern layout 150 is a two-dimensional (2D) pattern layout, including features having feature portions oriented in both the preferred and non-preferred directions. In the depicted embodiment, each feature 151, 152, 153, 155, 156, 157, 158, and 159 includes a single feature portion oriented in the preferred direction. Feature 151 corresponds with routing track 141, feature 152 corresponds with routing track 142, features 153 and 155 correspond with routing track 143, feature 156 corresponds with routing track 144, features 157 and 158 correspond with routing track 145, and feature 159 corresponds with routing track 146. Feature 154 includes feature portions oriented in the preferred direction and the non-preferred direction, and corresponds with routing tracks 142, 143, and 144. More specifically, feature portion 154A is oriented in the preferred direction and corresponds with routing track 142, feature portion 154B is oriented in the non-preferred direction and corresponds with routing tracks 142-144, and feature portion 154C is oriented in the preferred direction and corresponds with routing track 144.

In the depicted embodiment, as noted above, a feature splitting constraint specifies that no feature splitting is allowed in the preferred direction or the non-preferred direction for a multiple patterning compliant layout. More specifically, the feature splitting constraint specifies that (1) there can be no G0-spaces in the preferred direction between features, and that (2) all features must begin and end on routing tracks of the same color (or alternatively, that all features must occupy an odd number of routing tracks).

Applying the feature splitting constraint in the preferred direction, spacings in the preferred direction between features 151-159 of the pattern layout 150 are evaluated to ensure that there are no G0-spaces in the preferred direction between features. For example, spacing S is evaluated between features 152 and 154 within the same routing track 142, spacing S is evaluated between features 153 and 154 within the same routing track 143, spacing S is evaluated between features 155 and 154 within the same routing track 143, spacing S is evaluated between features 154 and 156 within the same routing track 144, and spacing S is evaluated between features 157 and 158 within the same routing track 145. In the depicted embodiment, the spacings in the preferred direction between features (152/154, 153/154, 154/155, 154/156, and 157/158), are larger than or equal to the G0-space. The pattern layout 150 thus complies with the feature splitting constraint applied in the preferred direction.

Applying the feature splitting constraint in the non-preferred direction, colors of the beginning and ending routing tracks of each feature 151-159 is evaluated to determine whether any features will require splitting. Features 151, 152, 153, 155, 156, 157, 158, and 159 each occupy a single routing track of a single color, thus no splitting is required for these features. Feature 154 occupies three routing tracks, routing tracks 142-144, where the beginning routing track 142 and ending routing track 144 are the same color, Color B. Since feature 154 begins and ends on routing tracks of the same color, feature 154 will not require splitting for pattern decomposition. All the features 151-159 thus begin and end on routing tracks of the same color, indicating that no feature splitting will be required in pattern decomposition. Alternatively, as noted above, applying the feature splitting constraint in the non-preferred direction can involve evaluating a number of routing tracks occupied by each feature 151-159. In the depicted embodiment, features 151, 152, 153, 155, 156, 157, 158, and 159 each occupy a single routing track, and feature 154 occupies three routing tracks. All the features 151-159 thus occupy an odd number of routing tracks, indicating that no feature splitting will be required in pattern decomposition. Accordingly, the pattern layout 150 complies with the feature splitting constraint applied in the non-preferred direction. It should be noted that because features occupying adjacent routing tracks will be assigned to different masks (since no two adjacent routing tracks will be designated the same color), G0-spaces are allowed in the non-preferred direction between adjacent features.

Since the pattern layout 150 compiles with the feature splitting constraints applied in the preferred and non-preferred directions, the features 151-159 are colored based on the color of each feature's corresponding routing track or tracks. Feature 151 corresponds with routing track 141 (designated as a Color A track), so feature 151 is colored Color A. Feature 152 corresponds with routing track 142 (designated as a Color B track), so feature 152 is colored Color B. Features 153 and 155 correspond with routing track 143 (designated as a Color A track), so features 153 and 155 are colored Color A. Feature 154 does not require splitting, so it is designated the color of its corresponding beginning (142) and ending (144) routing tracks, Color B. Feature 156 corresponds with routing track 144 (designated as a Color B track), so feature 156 is colored Color B. Features 157 and 158 correspond with routing track 145 (designated as a Color A track), so features 157 and 158 are colored Color A. Feature 159 corresponds with routing track 146 (designated as a Color B track), so feature 159 is colored Color B. The colored pattern layout 150 may then be decomposed into two masks, where Color A features are formed on one mask and Color B features are formed on another mask. The masks may be used to print an image of the pattern layout 150 into a photoresist layer during integrated circuit device manufacturing.

Figure 8:
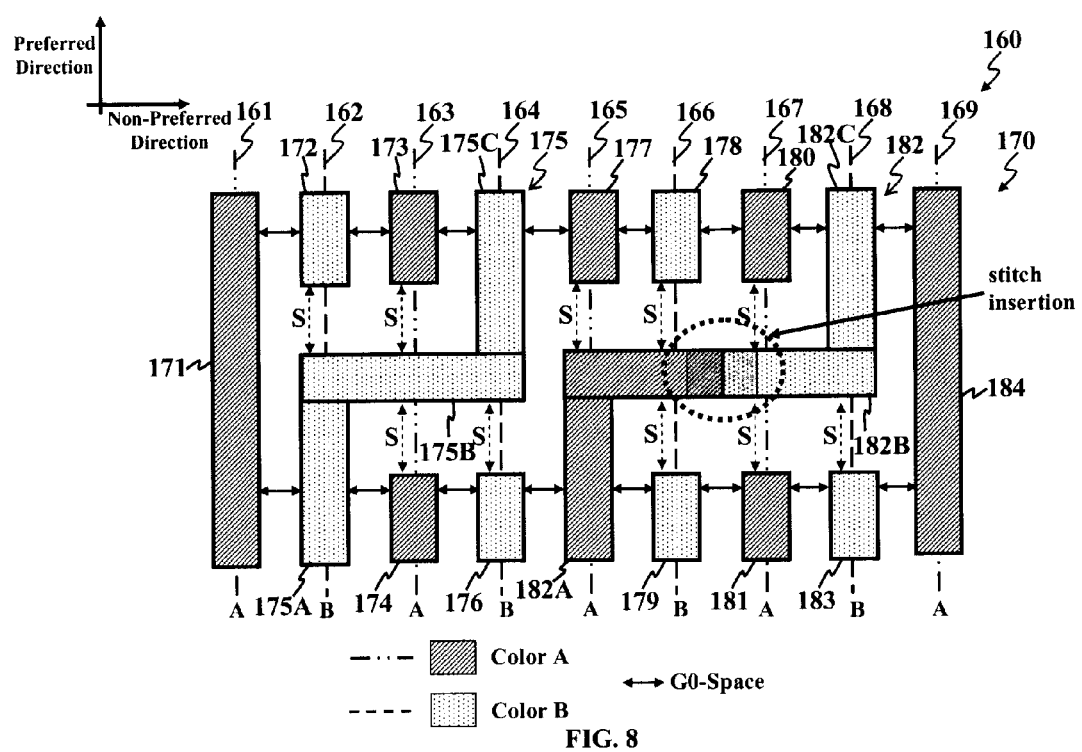

Referring to FIG. 8, a feature splitting constraint specifies that feature splitting is not allowed in a preferred direction and feature splitting is allowed in a non-preferred direction. In FIG. 8, a routing grid 160 having color-defined routing tracks 161-169 is provided. A pattern layout 170 is applied to the routing grid 160 having color-defined routing tracks 161-169, such that features 171-184 of the pattern layout 170 correspond with at least one of the routing tracks 161-169. The routing grid 160 having color-defined routing tracks 161-169 is similar to the routing grids described above, and the pattern layout 170 having features 171-184 is similar to the pattern layouts described above. In the depicted embodiment, the pattern layout 170 is a two-dimensional (2D) pattern layout, including features having feature portions oriented in both the preferred and non-preferred directions. In the depicted embodiment, each feature 171, 172, 173, 174, 176, 177, 178, 179, 180, 181, 183, and 184 includes a single feature portion oriented in the preferred direction. Feature 171 corresponds with routing track 161, feature 172 corresponds with routing track 162, features 173 and 174 correspond with routing track 163, feature 176 corresponds with routing track 164, feature 177 corresponds with routing track 165, features 178 and 179 correspond with routing track 166, features 180 and 181 correspond with routing track 167, feature 183 corresponds with routing track 168, and feature 184 corresponds with routing track 169. Feature 175 includes feature portions oriented in the preferred direction and the non-preferred direction, and corresponds with routing tracks 162, 163, and 164. More specifically, feature portion 175A is oriented in the preferred direction and corresponds with routing track 162, feature portion 175B is oriented in the non-preferred direction and corresponds with routing tracks 162-164, and feature portion 175C is oriented in the preferred direction and corresponds with routing track 164. Feature 182 includes feature portions oriented in the preferred direction and the non-preferred direction, and corresponds with routing tracks 165, 166, 167, and 168. More specifically, feature portion 182A is oriented in the preferred direction and corresponds with routing track 165, feature portion 182B is oriented in the non-preferred direction and corresponds with routing tracks 165-168, and feature portion 182C is oriented in the preferred direction and corresponds with routing track 168.

In the depicted embodiment, as noted above, a feature splitting constraint specifies that no feature splitting is allowed in the preferred direction and features splitting is allowed in the non-preferred direction for a multiple patterning compliant layout. More specifically, the feature splitting constraint specifies that (1) there can be no G0-spaces in the preferred direction between features, and that (2) features beginning and ending on routing tracks of the same color (or alternatively, features occupying an odd number of routing tracks) do not require splitting, and features beginning and ending on routing tracks of different colors (or alternatively, features occupying an even number of routing tracks) require splitting. Though the feature splitting constraint indicates that feature splitting is allowed in the non-preferred direction, if the pattern layout requires feature splitting, it is not a multiple patterning compliant layout until any required stitch insertions have been applied to the pattern layout.

Applying the feature splitting constraint applied in the preferred direction, spacings in the preferred direction between features 171-184 of the pattern layout 170 are evaluated to ensure that there are no G0-spaces in the preferred direction between features. For example, spacing S is evaluated between features 172 and 175 within the same routing track 162, spacing S is evaluated between features 173 and 175 within the same routing track 163, spacing S is evaluated between features 174 and 175 within the same routing track 163, spacing S is evaluated between features 175 and 176 within the same routing track 164, spacing S is evaluated between features 177 and 182 within the same routing track 165, spacing S is evaluated between features 178 and 182 within the same routing track 166, spacing S is evaluated between features 179 and 182 within the same routing track 166, spacing S is evaluated between features 180 and 182 within the same routing track 167, spacing S is evaluated between features 181 and 182 within the same routing track 167, and spacing S is evaluated between features 182 and 183 within the same routing track 168. In the depicted embodiment, the spacings in the preferred direction between features (172/175, 173/175, 174/175, 175/176, 177/182, 178/182, 179/182, 180/182, 181/182, and 182/183), are larger than or equal to the G0-space. The pattern layout 170 thus complies with the feature splitting constraint applied in the preferred direction.

Applying the feature splitting constraint in the non-preferred direction, colors of the beginning and ending routing tracks of each feature 171-184 are evaluated to determine whether any features will require splitting. Features 171, 172, 173, 174, 176, 177, 178, 179, 180, 181, 183, and 184 each occupy a single routing track of a single color, thus no splitting is required for these features. Feature 175 occupies three routing tracks, routing tracks 162-164, where the beginning routing track 162 and ending routing track 164 are the same color, Color B. Since feature 175 begins and ends on routing tracks of the same color, feature 175 will not require splitting for pattern decomposition. In contrast, feature 182 occupies four routing tracks, routing tracks 165-168, where the beginning routing track 165 and ending routing track 168 are different colors, Color A and Color B respectively. Since feature 182 begins and ends on routing tracks of different colors, feature 182 will require splitting for pattern decomposition. Alternatively, as noted above, applying the feature splitting constraint in the non-preferred direction can involve evaluating a number of routing tracks occupied by each feature 171-184. In the depicted embodiment, features 171, 172, 173, 174, 176, 177, 178, 179, 180, 181, 183, and 184 each occupy a single routing track, feature 175 occupies three routing tracks, and feature 182 occupies four routing tracks. It can thus be quickly determined that only features 182, which occupies an even number of routing tracks, will require splitting. Since feature 182 requires splitting, the pattern layout 150 is not a multiple patterning compliant layout. However, since the feature splitting constraint applied in the non-preferred direction allows splitting, a stitch insertion is applied to the feature 182, such that the pattern layout 150 becomes a multiple patterning compliant layout. In the depicted embodiment, the stitch insertion is applied to the feature portion 182B of feature 182, which is oriented in the non-preferred direction. For example, an odd number of stitches is applied to the feature portion 182B. This can involve extending a length of either a portion of the feature portion 182B that will be assigned to Color A or a portion of the feature portion 182B that will be assigned to Color B, such that an overlap area exists in the pattern layout 170 with respect to feature 182. Accordingly, the pattern layout 170 complies with the feature splitting constraint applied in the non-preferred direction. It should be noted that because features occupying adjacent routing tracks will be assigned to different masks (since no two adjacent routing tracks will be designated the same color), G0-spaces are allowed in the non-preferred direction between adjacent features.

Once the stitch insertion is applied to the pattern layout 170 so that the pattern layout 170 compiles with the feature splitting constraints applied in the preferred and non-preferred direction, the features 171-184 are colored based on the color of each feature's corresponding routing track or tracks. Feature 171 corresponds with routing track 161 (designated as a Color A track), so feature 171 is colored Color A. Feature 172 corresponds with routing track 162 (designated as a Color B track), so feature 172 is colored Color B. Features 173 and 174 correspond with routing track 163 (designated as a Color A track), so features 173 and 174 are colored Color A. Feature 176 corresponds with routing track 164 (designated as a Color B track), so feature 176 is colored Color B. Feature 177 corresponds with routing track 165 (designated as a Color A track), so feature 177 is colored Color A. Features 178 and 179 correspond with routing track 166 (designated as a Color B track), so features 178 and 179 are colored Color B. Features 180 and 181 correspond with routing track 167 (designated as a Color A track), so features 180 and 181 are colored Color A. Feature 183 corresponds with routing track 168 (designated as a Color B track), so feature 183 is colored Color B. Feature 184 corresponds with routing track 169 (designated as a Color A track), so feature 184 is colored Color B. Feature 175 does not require splitting, so it is designated the color of its corresponding beginning (162) and ending (164) routing tracks, Color B. In contrast, feature 182 begins and ends on routing tracks of different colors (beginning on Color A routing track 165 and ending on Color B routing track 168), and thus requires splitting. A portion of feature 182 is colored Color A, the color of its beginning routing track 165, and another portion of the feature 182 is colored Color A, the color of its ending routing track 168. More specifically, since feature portions 182A and 182C respectively correspond with routing tracks 165 and 168 (designated as Color A and Color B, respectively), feature portion 182A is colored Color A and feature portion 182C is colored Color B. Feature portion 182B begins on the routing track 165 of Color A and ends on the routing track 168 of Color B, and thus, feature portion 182B is colored both Colors A and B as illustrated in FIG. 8. The colored Color A and Color B portions of feature portion 182B overlap one another to incorporate the stitch. The colored pattern layout 170 may then be decomposed into two masks, where Color A features are formed on one mask and Color B features are formed on another mask. The masks may be used to print an image of the pattern layout 170 into a photoresist layer during integrated circuit device manufacturing.

FIGS. 9-13 illustrate pattern layouts having stitch insertions that are multiple patterning compliant layouts according to the method 10 of FIG. 1. In FIGS. 9-13, a feature splitting constraint applied to the pattern layouts is similar to the feature splitting constraint applied to the pattern layout 170 of FIG. 8. More specifically, the feature splitting constraint applied to the pattern layouts in FIGS. 9-13 specifies that no feature splitting is allowed in the preferred direction and feature splitting is allowed in the non-preferred direction for a multiple patterning compliant layout. More specifically, the feature splitting constraint specifies that (1) there can be no G0-spaces in the preferred direction between features, and that (2) features beginning and ending on routing tracks of the same color (or alternatively, features occupying an odd number of routing tracks) do not require splitting, and features beginning and ending on routing tracks of different colors (or alternatively, features occupying an even number of routing tracks) require splitting.

In FIGS. 9-13, the required stitch insertions have been applied to features requiring splitting in the pattern layouts to achieve multiple patterning compliant layouts. Each of FIGS. 9-13 provides various stitching methods (parameters) that can be implemented for the stitch insertions, depending on characteristics of a feature portion oriented in the non-preferred direction that will receive the stitch insertion. Typically, whether stitch insertions with sufficient overlap length for manufacturing can be inserted into the feature portions oriented in the non-preferred direction depends on manufacturing capabilities. In the depicted embodiment, specifically FIG. 913, stitch insertions with sufficient overlap length for manufacturing can be easily inserted into feature portions oriented in the non-preferred direction that correspond with more than two routing tracks (in other words, "long jogs"). For example, a stitch insertion can be placed in a center of a long jog with sufficient stitch overlap length for manufacturing. In contrast, feature portions oriented in the non-preferred direction that correspond with two or less routing tracks (in other words, "small jogs") sometimes present difficulty providing stitch insertions having sufficient overlap length for manufacturing. Accordingly, a routing track manufacturing threshold can be set that defines a number of routing tracks a feature oriented in the non-preferred direction must correspond with to ensure sufficient stitch insertion overlap length for manufacturing. In the depicted embodiment, the routing track manufacturing threshold indicates that feature portions oriented in the non-preferred direction that occupy (correspond with) two or less routing tracks will present difficulty providing stitch insertions having sufficient overlap length for manufacturing. Thus, FIGS. 9-13 provide various stitching methods (parameters) that can be implemented for stitch insertions in "small jogs," in other words, feature portions oriented in the non-preferred direction that correspond a number of routing tracks less than or equal to the routing track manufacturing threshold (here, two or less routing tracks).

Figure 9:
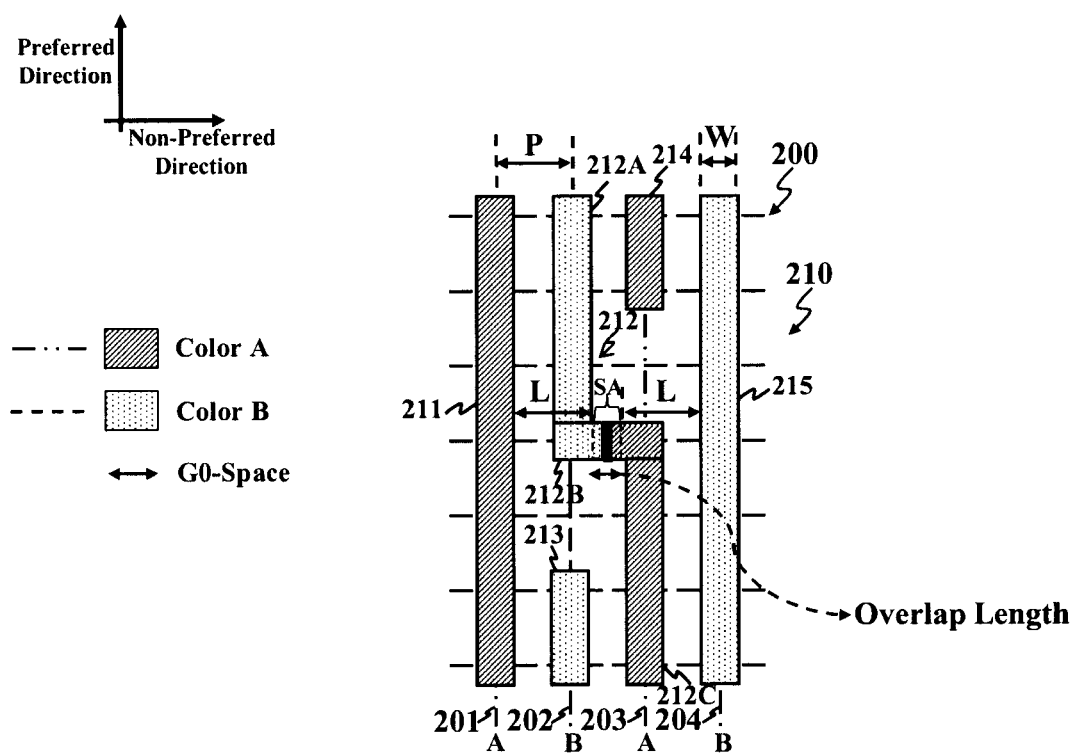
FIGS. 9-13 illustrate various pattern layouts having stitch insertions that are multiple patterning compliant layouts according to the method of FIG. 1

Referring to FIG. 9, a routing grid 200 having color-defined routing tracks 201-204 is provided. A pattern layout 210 is applied to the routing grid 200 having color-defined routing tracks 201-204, such that features 211-215 of the pattern layout 210 correspond with at least one of the routing tracks 201-204. The routing grid 200 having color-defined routing tracks 201-204 is similar to the routing grids described above, and the pattern layout 210 having features 211-215 is similar to the pattern layouts described above. In the depicted embodiment, each feature 211, 213, 214, and 215 includes a single feature portion oriented in the preferred direction. Feature 211 corresponds with routing track 201, feature 213 corresponds with routing track 202, feature 214 corresponds with routing track 203, and feature 215 corresponds with routing track 204. Feature 212 includes feature portions oriented in the preferred direction and the non-preferred direction, and corresponds with routing tracks 202 and 203. More specifically, feature portion 212A is oriented in the preferred direction and corresponds with routing track 202, feature portion 212B is oriented in the non-preferred direction and corresponds with routing tracks 202-203, and feature portion 212C is oriented in the preferred direction and corresponds with routing track 204.

Applying the feature splitting constraint in the preferred direction, spacings in the preferred direction between features 211-215 of the pattern layout 210 are evaluated to ensure that there are no G0-spaces in the preferred direction between features. In the depicted embodiment, the spacings in the preferred direction between features (212/213 and 212/214) are larger than or equal to the G0-space. The pattern layout 210 thus complies with the feature splitting constraint applied in the preferred direction. Applying the feature splitting constraint in the non-preferred direction, colors of the beginning and ending routing tracks of each feature 211-215 are evaluated to determine whether any features will require splitting. Features 211, 213, 214, and 215 each occupy a single routing track of a single color, thus no splitting is required for these features. Feature 212 occupies two routing tracks, routing tracks 202-203, where the beginning routing track 202 and ending routing track 203 are different colors, Color B and Color A respectively. Since feature 212 begins and ends on routing tracks of different colors, feature 212 will require splitting for pattern decomposition. In the depicted embodiment, a stitch insertion, SA, is applied to the feature portion 212B of feature 212, which is oriented in the non-preferred direction. Since the feature portion 212B oriented in the non-preferred direction (also referred to as a jog) occupies only two routing tracks (in other words, occupies a number of routing tracks less than or equal to the routing track manufacturing threshold), an overlap length of the SA is limited. The feature portion 212B is also a line end, which is defined as an end of a relatively thin pattern, where a line-end is defined as a line having a line width less than a line-end width threshold, D. In the depicted embodiment, a line-end width threshold, D, is about 54 nm, and the feature portion 212 is less than D, and is thus designated as a line-end. Accordingly, a maximum overlap length of the SA is less than or equal to:

$$\text{Maximum Stitch Overlap Length} = 3P - W/2 - W/2 - 2L$$

where P is a minimum pitch between routing tracks, W is a minimum line width, and L is a minimum spacing between a line and a line-end. In an example, a minimum routing pitch, P, is about 66 nm; a minimum line width, W, is about 34 nm; and a minimum spacing between a line and a line-end, L, is about 78 nm. Accordingly, the maximum stitch overlap length is about 8 nm. Applying the maximum stitch overlap length to the depicted embodiment, the stitch overlap length may thus be about 0 nm to about 8 nm.

Once the stitch insertion is applied to the pattern layout 210 so that the pattern layout 210 compiles with the feature splitting constraints applied in the preferred and non-preferred direction, the features 211-215 are colored based on the color of each feature's corresponding routing track or tracks. Feature 211 corresponds with routing track 201 (designated as a Color A track), so feature 211 is colored Color A. Feature 213 corresponds with routing track 202 (designated as a Color B track), so feature 213 is colored Color B. Feature 214 corresponds with routing track 203 (designated as a Color A track), so feature 214 is colored Color A. Feature 215 corresponds with routing track 204 (designated as a Color B track), so feature 215 is colored Color B. Feature 212 begins and ends on routing tracks of different colors (beginning on Color B routing track 202 and ending on Color A routing track 203). A portion of feature 212 is colored Color B, the color of its beginning routing track 202, and another portion of the feature 212 is colored Color A, the color of its ending routing track 203. More specifically, since feature portion 212A corresponds with routing track 202 (designated as a Color B track) and feature portion 212C corresponds with routing track 203 (designated as a Color A track), feature portions 212A and 212C are respectively colored Color B and Color A. Feature portion 212B begins on the routing track 202 of Color B and ends on the routing track 203 of Color A, and thus, feature portion 212B is colored both Colors A and B as illustrated in FIG. 9. The colored Color A and Color B portions of feature portion 212B overlap one another to incorporate the stitch according to the discussion above. The colored pattern layout 210 may then be decomposed into two masks, where Color A features are formed on one mask and Color B features are formed on another mask. The masks may be used to print an image of the pattern layout 210 into a photoresist layer during integrated circuit device manufacturing.

Figure 10:
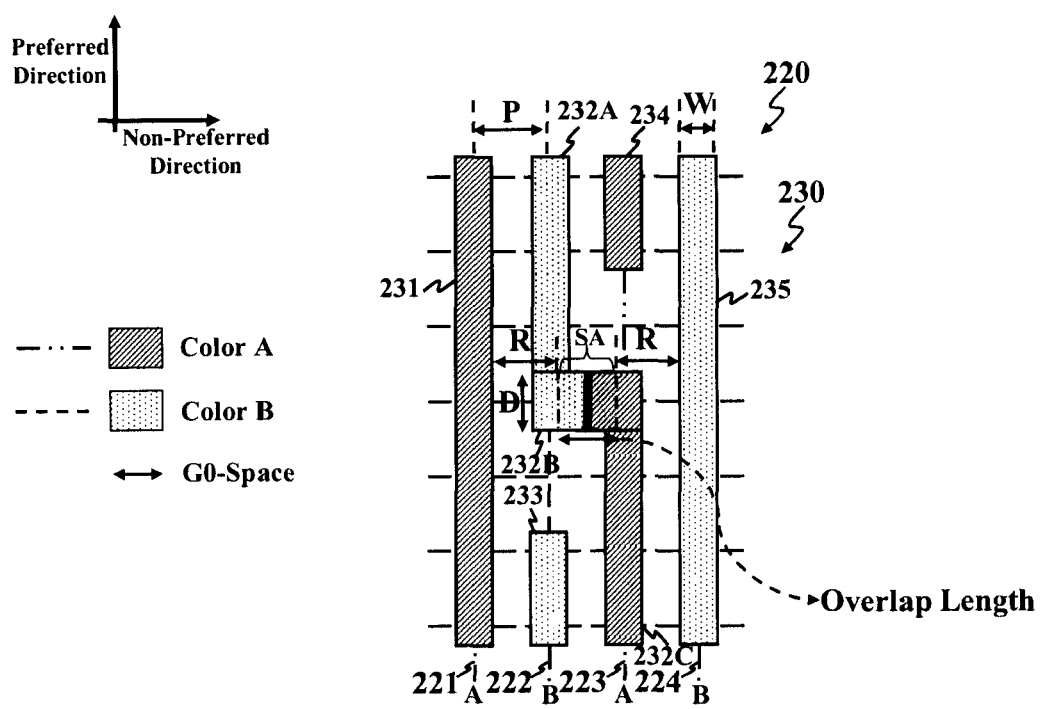

Referring to FIG. 10, a routing grid 220 having color-defined routing tracks 221-224 is provided. A pattern layout 230 is applied to the routing grid 220 having color-defined routing tracks 221-224, such that features 231-235 of the pattern layout 230 correspond with at least one of the routing tracks 221-224. The routing grid 220 having color-defined routing tracks 221-224 is similar to the routing grids described above, and the pattern layout 230 having features 231-235 is similar to the pattern layouts described above. In the depicted embodiment, each feature 231, 233, 234, and 235 includes a single feature portion oriented in the preferred direction. Feature 231 corresponds with routing track 221, feature 233 corresponds with routing track 222, feature 234 corresponds with routing track 223, and feature 235 corresponds with routing track 224. Feature 232 includes feature portions oriented in the preferred direction and the non-preferred direction, and corresponds with routing tracks 222 and 223. More specifically, feature portion 232A is oriented in the preferred direction and corresponds with routing track 222, feature portion 232B is oriented in the non-preferred direction and corresponds with routing tracks 222-223, and feature portion 232C is oriented in the preferred direction and corresponds with routing track 224.

Applying the feature splitting constraint applied in the preferred direction, spacings in the preferred direction between features 231-235 of the pattern layout 230 are evaluated to ensure that there are no G0-spaces in the preferred direction between features. In the depicted embodiment, the spacings in the preferred direction between features (232/233 and 232/234) are larger than or equal to the G0-space. The pattern layout 230 thus complies with the feature splitting constraint applied in the preferred direction. Applying the feature splitting constraint in the non-preferred direction, colors of the beginning and ending routing tracks of each feature 231-235 are evaluated to determine whether any features will require splitting. Features 231, 233, 234, and 235 each occupy a single routing track of a single color, thus no splitting is required for these features. Feature 232 occupies two routing tracks, routing tracks 222-223, where the beginning routing track 222 and ending routing track 223 are different colors, Color B and Color A respectively. Since feature 232 begins and ends on routing tracks of different colors, feature 232 will require splitting for pattern decomposition. In the depicted embodiment, a stitch insertion, SA, is applied to the feature portion 232B of feature 232, which is oriented in the non-preferred direction. Since the feature 232 oriented in the non-preferred direction occupies only two routing tracks (in other words, occupies a number of routing tracks less than or equal to the routing track manufacturing threshold), an overlap length of the SA is limited. Further, a width of the feature portion 232B is greater than or equal to a line-end width threshold, D, so the feature portion 232B is referred to as a "fat jog" (or "small fat jog" since the feature 232 also occupies a number of routing tracks less than or equal to the routing track manufacturing threshold). Accordingly, an overlap length of the stitch insertion may be greater than the overlap length allowed for a minimum width feature portion (feature portion designated as a line end for having a width less than the line-end width threshold) receiving a stitch insertion (such as feature portion 212B in FIG. 9). For example, in the depicted embodiment, a maximum overlap length of the SA is less than or equal to:

$$\text{Maximum Stitch Overlap Length} = 3P - W/2 - W/2 - 2R$$

where P is a minimum pitch between routing tracks, W is a minimum line width, and R is a minimum run-run spacing (a spacing between two non-line-end patterns (lines), which is typically larger than a minimum spacing between a line and a line-end, L, discussed above). In an example, a minimum routing pitch, P, is about 66 nm; a minimum line width, W, is about 34 nm; a minimum run-run spacing, R, is about 60 nm; and D is greater than or equal to about 54 nm. Accordingly, the maximum stitch overlap length is about 44 nm. Applying the maximum stitch overlap length to the depicted embodiment, the stitch overlap length may thus be about 0 nm to about 44 nm.

Once the stitch insertion is applied to the pattern layout 230 so that the pattern layout 230 compiles with the feature splitting constraints applied in the preferred and non-preferred direction, the features 231-235 are colored based on the color of each feature's corresponding routing track or tracks. As illustrated in FIG. 10, the features 231-235 are colored similar to features 211-215 described above with reference to FIG. 9. The colored pattern layout 230 may then be decomposed into two masks, where Color A features are formed on one mask and Color B features are formed on another mask. The masks may be used to print an image of the pattern layout 230 into a photoresist layer during integrated circuit device manufacturing.

Figure 11:
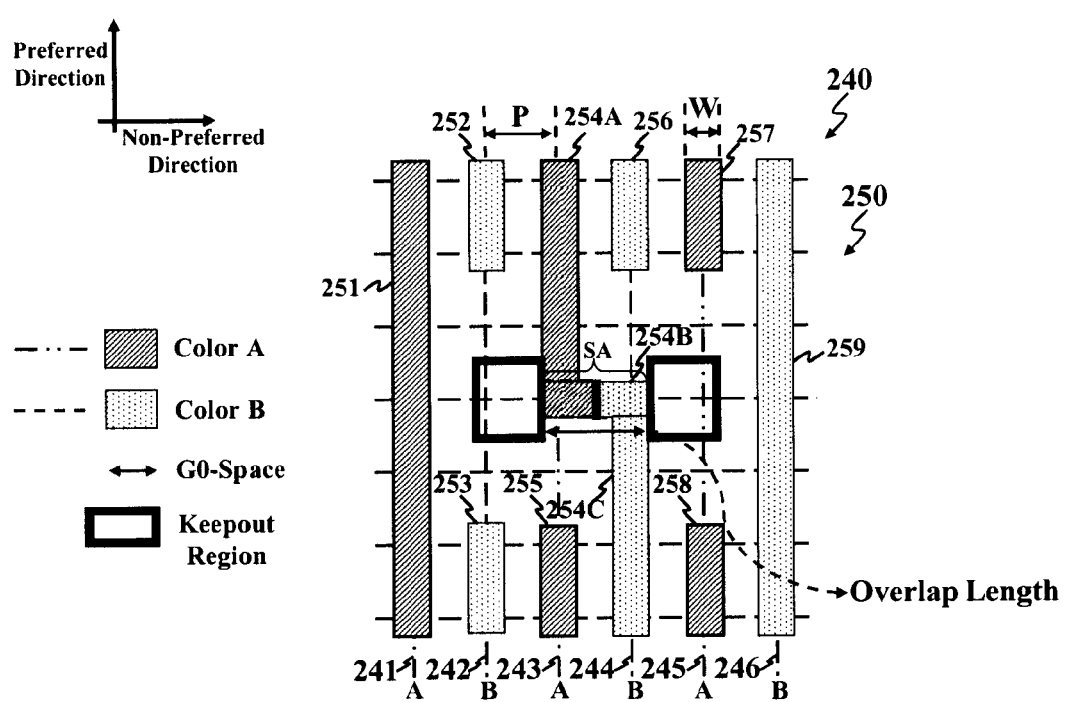

Referring to FIG. 11, a routing grid 240 having color-defined routing tracks 241-246 is provided. A pattern layout 250 is applied to the routing grid 240 having color-defined routing tracks 241-246, such that features 251-259 of the pattern layout 250 correspond with at least one of the routing tracks 241-246. The routing grid 240 having color-defined routing tracks 241-246 is similar to the routing grids described above, and the pattern layout 250 having features 251-259 is similar to the pattern layouts described above. In the depicted embodiment, each feature 251, 252, 253, 255, 256, 257, 258, and 259 includes a single feature portion oriented in the preferred direction. Feature 251 corresponds with routing track 241, features 252 and 253 correspond with routing track 242, feature 255 corresponds with routing track 243, feature 256 corresponds with routing track 244, features 257 and 258 correspond with routing track 245, and feature 259 corresponds with routing track 246. Feature 254 includes feature portions oriented in the preferred direction and the non-preferred direction, and corresponds with routing tracks 243 and 244. More specifically, feature portion 254A is oriented in the preferred direction and corresponds with routing track 243, feature portion 254B is oriented in the non-preferred direction and corresponds with routing tracks 243-244, and feature portion 254C is oriented in the preferred direction and corresponds with routing track 244.

Applying the feature splitting constraint applied in the preferred direction, spacings in the preferred direction between features 251-259 of the pattern layout 250 are evaluated to ensure that there are no G0-spaces in the preferred direction between features. In the depicted embodiment, the spacings in the preferred direction between features (252/253, 254/255, 254/256, and 257/258) are larger than or equal to the G0-space. The pattern layout 250 thus complies with the feature splitting constraint applied in the preferred direction. Applying the feature splitting constraint in the non-preferred direction, colors of the beginning and ending routing tracks of each feature 251-259 is evaluated to determine whether any features will require splitting. Features 251, 252, 253, 255, 256, 257, 258, and 259 each occupy a single routing track of a single color, thus no splitting is required for these features. Feature 254 occupies two routing tracks, routing tracks 243-244, where the beginning routing track 243 and ending routing track 244 are different colors, Color A and Color B respectively. Since feature 254 begins and ends on routing tracks of different colors, feature 254 will require splitting for pattern decomposition. In the depicted embodiment, a stitch insertion, SA, is applied to the feature portion 254B of feature 254, which is oriented in the non-preferred direction. Since the feature portion 254B oriented in the non-preferred direction (also referred to as a jog) occupies only two routing tracks (in other words, occupies a number of routing tracks less than or equal to the routing track manufacturing threshold), an overlap length of the SA is limited. In the depicted embodiment, keepout regions (pattern-free regions) are reserved adjacent each end of the feature portion 254B oriented in the non-preferred direction. The pattern-free regions prevents any router decisions (or design decisions) from generating another feature occupying or overlapping the pattern-free regions. This ensures that the pattern layout 250 will remain compliant with any minimum width or minimum spacing rules, while allowing a longer stitch overlap length than possible otherwise (FIG. 9). In the depicted embodiment, the pattern-free regions reserved adjacent each end of the feature portion 254B allows a maximum overlap length of the SA that is less than or equal to:

$$\text{Maximum Stitch Overlap Length} = P + W/2 + W/2$$

where P is a minimum pitch between routing tracks and W is a minimum line width. In an example, a minimum routing pitch, P, is about 66 nm, and a minimum line width, W, is about 34 nm. Accordingly, the maximum stitch overlap length is about 100 nm. Applying the maximum stitch overlap length to the depicted embodiment, the stitch overlap length may thus be about 0 nm to about 100 nm.

Once the stitch insertion is applied to the pattern layout 250 so that the pattern layout 250 compiles with the feature splitting constraints applied in the preferred and non-preferred direction, the features 251-259 are colored based on the color of each feature's corresponding routing track or tracks. Feature 251 corresponds with routing track 241 (designated as a Color A track), so feature 251 is colored Color A. Features 252 and 253 correspond with routing track 242 (designated as a Color B track), so features 252 and 253 are colored Color B. Feature 255 corresponds with routing track 243 (designated as a Color A track), so feature 255 is colored Color A. Feature 256 corresponds with routing track 244 (designated as a Color B track), so feature 256 is colored Color B. Features 257 and 258 correspond with routing track 245 (designated as a Color A track), so features 257 and 258 are colored Color A. Feature 259 corresponds with routing track 246 (designated as a Color B track), so feature 259 is colored Color B. Feature 254 begins and ends on routing tracks of different colors (beginning on Color A routing track 243 and ending on Color B routing track 244). A portion of feature 254 is thus colored Color A, the color of its beginning routing track 243, and another portion of the feature 254 is colored Color B, the color of its ending routing track 244. More specifically, since feature portion 254A corresponds with routing track 243 (designated as a Color A track) and feature portion 254C corresponds with routing track 244 (designated as a Color B track), feature portions 254A and 254C are respectively colored Color A and Color B. Feature portion 254B begins on the routing track 243 of Color A and ends on the routing track 244 of Color B, and thus, feature portion 254B is colored both Colors A and B as illustrated in FIG. 11. The colored Color A and Color B portions of feature portion 254B overlap one another to incorporate the stitch according to the discussion above. The colored pattern layout 250 may then be decomposed into two masks, where Color A features are formed on one mask and Color B features are formed on another mask. The masks may be used to print an image of the pattern layout 250 into a photoresist layer during integrated circuit device manufacturing.

Figure 12:
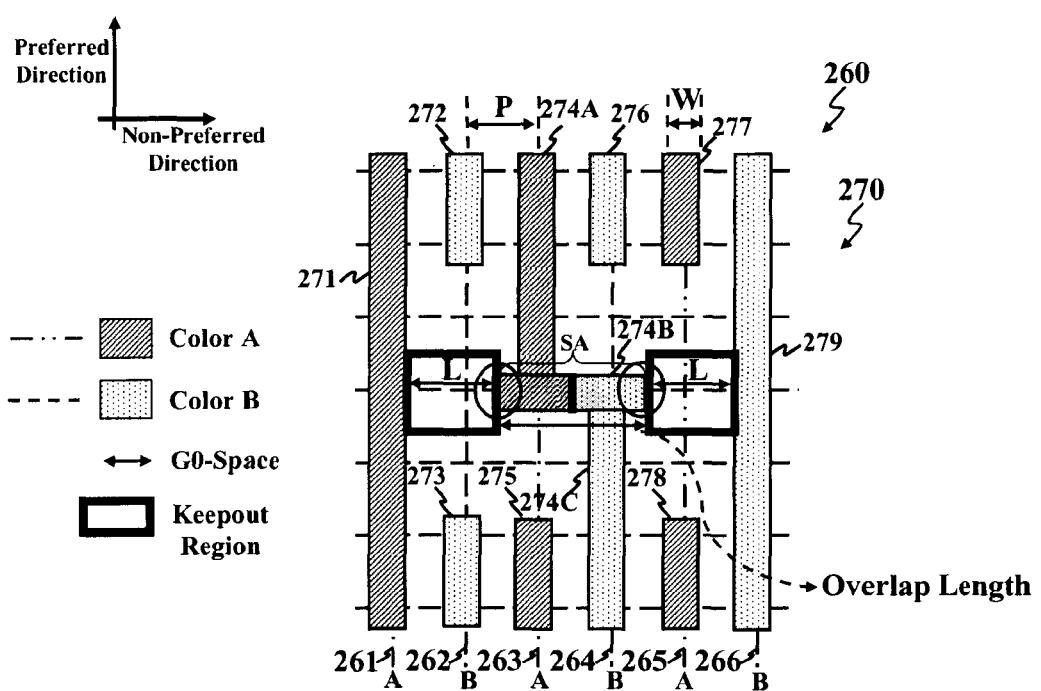

Referring to FIG. 12, a routing grid 260 having color-defined routing tracks 261-266 is provided. A pattern layout 270 is applied to the routing grid 260 having color-defined routing tracks 261-266, such that features 271-279 of the pattern layout 270 correspond with at least one of the routing tracks 261-266. The routing grid 260 having color-defined routing tracks 261-266 is similar to the routing grids described above, and the pattern layout 270 having features 271-279 is similar to the pattern layouts described above. In the depicted embodiment, each feature 271, 272, 273, 275, 276, 277, 278, and 279 includes a single feature portion oriented in the preferred direction. Feature 271 corresponds with routing track 261, features 272 and 273 correspond with routing track 262, feature 275 corresponds with routing track 263, feature 276 corresponds with routing track 264, features 277 and 278 correspond with routing track 265, and feature 279 corresponds with routing track 266. Feature 274 includes feature portions oriented in the preferred direction and the non-preferred direction, and corresponds with routing tracks 263 and 264. More specifically, feature portion 274A is oriented in the preferred direction and corresponds with routing track 263, feature portion 274B is oriented in the non-preferred direction and corresponds with routing tracks 263-264, and feature portion 274C is oriented in the preferred direction and corresponds with routing track 264.

Applying the feature splitting constraint applied in the preferred direction, spacings in the preferred direction between features 271-279 of the pattern layout 250 are evaluated to ensure that there are no G0-spaces in the preferred direction between features. In the depicted embodiment, the spacings in the preferred direction between features (272/273, 274/275, 274/276, and 277/278) are larger than or equal to the G0-space. The pattern layout 270 thus complies with the feature splitting constraint applied in the preferred direction. Applying the feature splitting constraint in the non-preferred direction, colors of the beginning and ending routing tracks of each feature 271-279 is evaluated to determine whether any features will require splitting. Features 271, 272, 273, 275, 276, 277, 278, and 279 each occupy a single routing track of a single color, thus no splitting is required for these features. Feature 274 occupies two routing tracks (and thus feature 274 may be referred to as a "small jog"), routing tracks 263-264, where the beginning routing track 263 and ending routing track 264 are different colors, Color A and Color B respectively. Since feature 274 begins and ends on routing tracks of different colors, feature 274 will require splitting for pattern decomposition. In the depicted embodiment, a stitch insertion, SA, is applied to the feature portion 274B of feature 274, which is oriented in the non-preferred direction. Since the feature portion 274B oriented in the non-preferred direction (also referred to as a jog) occupies only two routing tracks (in other words, occupies a number of routing tracks less than or equal to the routing track manufacturing threshold), an overlap length of the SA is limited. In the depicted embodiment, the feature portion 274B extends past the feature portions 274A and 274B oriented in the preferred direction. This feature can be referred to as an "extended jog." Keepout regions (pattern-free regions) are reserved adjacent each end of the feature portion 274B oriented in the non-preferred direction. This ensures that the pattern layout 270 will remain compliant with any minimum width or minimum spacing rules. In the depicted embodiment, because the feature portion 274B is an extended jog and pattern-free regions are reserved adjacent each end of the feature portion 254B, the maximum overlap length of the SA is increased to less than or equal to:

$$\text{Maximum Stitch Overlap Length} = 5P - W/2 - W/2 - 2L$$

where P is a minimum pitch between routing tracks, W is a minimum line width, and L is a minimum spacing between a line and line end. In an example, a minimum routing pitch, P, is about 66 nm; a minimum line width, W, is about 34 nm; and a minimum spacing between a line and line end, L, is about 78 nm. Accordingly, the maximum stitch overlap length is about 140 nm. Applying the maximum stitch overlap length to the depicted embodiment, the stitch overlap length may thus be about 0 nm to about 140 nm.

Once the stitch insertion is applied to the pattern layout 270 so that the pattern layout 270 compiles with the feature splitting constraints applied in the preferred and non-preferred direction, the features 271-279 are colored based on the color of each feature's corresponding routing track or tracks. As illustrated in FIG. 12, the features 271-279 are colored similar to features 251-259 described above with reference to FIG. 11. The colored pattern layout 270 may then be decomposed into two masks, where Color A features are formed on one mask and Color B features are formed on another mask. The masks may be used to print an image of the pattern layout 270 into a photoresist layer during integrated circuit device manufacturing.

Figure 13:
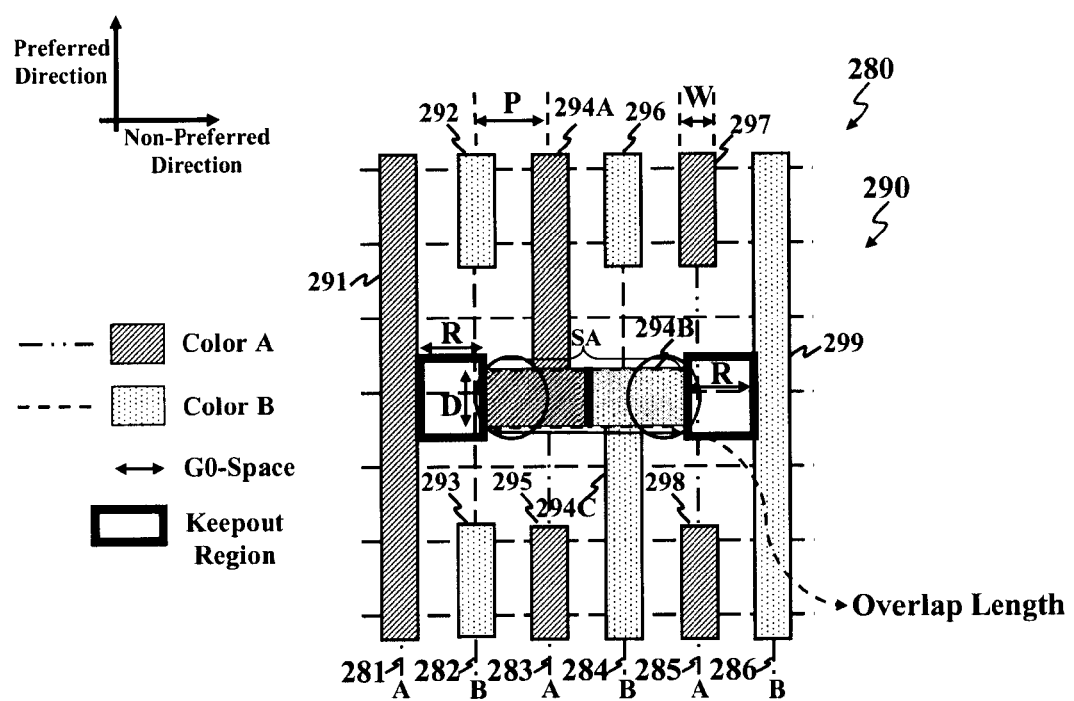

Referring to FIG. 13, a routing grid 280 having color-defined routing tracks 281-286 is provided. A pattern layout 290 is applied to the routing grid 280 having color-defined routing tracks 281-286, such that features 291-299 of the pattern layout 290 correspond with at least one of the routing tracks 281-286. The routing grid 280 having color-defined routing tracks 281-286 is similar to the routing grids described above, and the pattern layout 290 having features 291-299 is similar to the pattern layouts described above. In the depicted embodiment, each feature 291, 292, 293, 295, 296, 297, 298, and 299 includes a single feature portion oriented in the preferred direction. Feature 291 corresponds with routing track 281, features 292 and 293 correspond with routing track 282, feature 295 corresponds with routing track 283, feature 296 corresponds with routing track 284, features 297 and 298 correspond with routing track 285, and feature 299 corresponds with routing track 286. Feature 294 includes feature portions oriented in the preferred direction and the non-preferred direction, and corresponds with routing tracks 283 and 284. More specifically, feature portion 294A is oriented in the preferred direction and corresponds with routing track 283, feature portion 294B is oriented in the non-preferred direction and corresponds with routing tracks 283-284, and feature portion 294C is oriented in the preferred direction and corresponds with routing track 284.

Applying the feature splitting constraint applied in the preferred direction, spacings in the preferred direction between features 291-299 of the pattern layout 290 are evaluated to ensure that there are no G0-spaces in the preferred direction between features. In the depicted embodiment, the spacings in the preferred direction between features (292/293, 294/295, 294/296, and 297/298) are larger than or equal to the G0-space. The pattern layout 290 thus complies with the feature splitting constraint applied in the preferred direction. Applying the feature splitting constraint in the non-preferred direction, colors of the beginning and ending routing tracks of each feature 291-299 is evaluated to determine whether any features will require splitting. Features 291, 292, 293, 295, 296, 297, 298, and 299 each occupy a single routing track of a single color, thus no splitting is required for these features. Feature 294 occupies two routing tracks (and thus feature 294 may be referred to as a "small jog"), routing tracks 283-284, where the beginning routing track 283 and ending routing track 284 are different colors, Color A and Color B respectively. Since feature 294 begins and ends on routing tracks of different colors, feature 294 will require splitting for pattern decomposition. In the depicted embodiment, a stitch insertion, SA, is applied to the feature portion 294B of feature 294, which is oriented in the non-preferred direction. Since the feature portion 294B oriented in the non-preferred direction (also referred to as a jog) occupies only two routing tracks (in other words, occupies a number of routing tracks less than or equal to the routing track manufacturing threshold), an overlap length of the SA is limited. In the depicted embodiment, the feature portion 294B extends past the feature portions 279A and 294B oriented in the preferred direction, and the feature portion 294B is a non-minimum width line (in other words, a width of feature portion 294B is greater than or equal to a line-end width threshold, D). This feature can be referred to as a "fat extended jog." Keepout regions (pattern-free regions) are reserved adjacent each end of the feature portion 294B oriented in the non-preferred direction. This ensures that the pattern layout 290 will remain compliant with any minimum width or minimum spacing rules. In the depicted embodiment, because the feature portion 294B is a fat extended jog and pattern-free regions are reserved adjacent each end of the feature portion 294B, the maximum overlap length of the SA is increased to less than or equal to:

$$\text{Maximum Stitch Overlap Length} = 5P - W/2 - W/2 - 2R$$

where P is a minimum pitch between routing tracks, W is a minimum line width, and R is a minimum run-run spacing. In an example, a minimum routing pitch, P, is about 66 nm; a minimum line width, W, is about 34 nm; a minimum run-run spacing, R, is about 60 nm; and a line-end width threshold, D, is about 54 nm. Accordingly, the maximum stitch overlap length is about 176 nm. Applying the maximum stitch overlap length to the depicted embodiment, the stitch overlap length may thus be about 0 nm to about 176 nm.

Once the stitch insertion is applied to the pattern layout 290 so that the pattern layout 290 compiles with the feature splitting constraints applied in the preferred and non-preferred direction, the features 291-299 are colored based on the color of each feature's corresponding routing track or tracks. As illustrated in FIG. 13, the features 291-299 are colored similar to features 251-259 described above with reference to FIG. 11. The colored pattern layout 290 may then be decomposed into two masks, where Color A features are formed on one mask and Color B features are formed on another mask. The masks may be used to print an image of the pattern layout 290 into a photoresist layer during integrated circuit device manufacturing.

Figure 14:
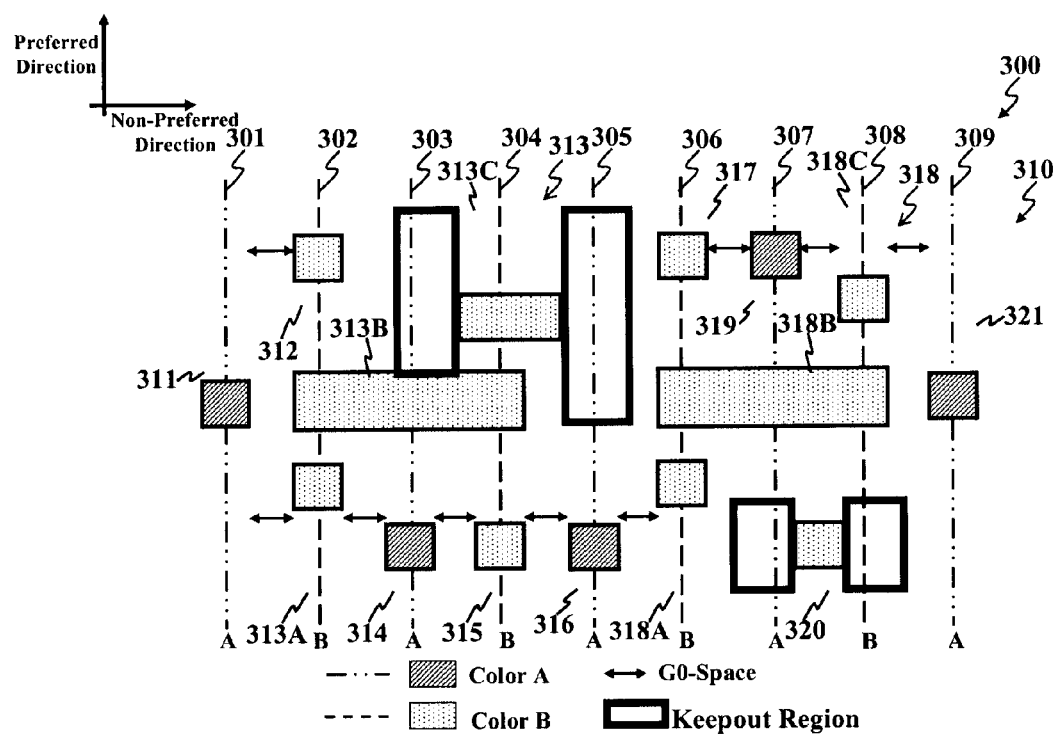
FIG. 14 illustrates a pattern layout that is a multiple patterning compliant layout according to the method of FIG. 1.

The keepout (pattern-free regions) reserved adjacent to features requiring stitch insertions may also be reserved adjacent to non-minimum width features oriented in the preferred direction or off-grid features. For example, in FIG. 14, a routing grid 300 having color-defined routing tracks 301-309 is provided. A pattern layout 310 is applied to the routing grid 300 having color-defined routing tracks 301-309, such that features 311-321 of the pattern layout 310 correspond with at least one of the routing tracks 301-309. The routing grid 300 having color-defined routing tracks 301-309 is similar to the routing grids described above, and the pattern layout 300 having features 311-321 is similar to the pattern layouts described above. In the depicted embodiment, each feature 311, 312, 314, 315, 316, 317, 319, 320, and 321 includes a single feature portion oriented in the preferred direction. Feature 311 corresponds with routing track 301, feature 312 corresponds with routing track 302, feature 314 corresponds with routing track 303, feature 315 corresponds with routing track 304, feature 316 corresponds with routing track 305, feature 317 corresponds with routing track 306, feature 319 corresponds with routing track 307, and feature 321 corresponds with routing track 309. Feature 320 is an off-grid feature, which could be designated as corresponding with either routing track 307 or routing track 308. Feature 313 includes feature portions oriented in the preferred direction and the non-preferred direction, and corresponds with routing tracks 302, 303, and 304. More specifically, feature portion 313A is oriented in the preferred direction and corresponds with routing track 302, feature portion 313B is oriented in the non-preferred direction and corresponds with routing tracks 302-304, and feature portion 313C is oriented in the preferred direction and corresponds with routing track 304. In the depicted embodiment, feature portion 313C is a non-minimum width feature. Feature 318 includes feature portions oriented in the preferred direction and the non-preferred direction, and corresponds with routing tracks 306, 307, and 308. More specifically, feature portion 318A is oriented in the preferred direction and corresponds with routing track 306, feature portion 318B is oriented in the non-preferred direction and corresponds with routing tracks 306-308, and feature portion 318C is oriented in the preferred direction and corresponds with routing track 308.

A feature splitting constraint specifies that no feature splitting is allowed in the preferred direction and feature splitting is allowed in the non-preferred direction for a multiple patterning compliant layout. More specifically, the feature splitting constraint specifies that (1) there can be no G0-spaces in the preferred direction between features, and that (2) features beginning and ending on routing tracks of the same color (or alternatively, features occupying an odd number of routing tracks) do not require splitting, and features beginning and ending on routing tracks of different colors (or alternatively, features occupying an even number of routing tracks) require splitting.

Applying the feature splitting constraint applied in the preferred direction, spacings in the preferred direction between features 311-321 of the pattern layout 310 are evaluated to ensure that there are no G0-spaces in the preferred direction between features. In the depicted embodiment, the spacings in the preferred direction between features (312/313, 313/314, 313/315, 317/318, 319/318, and 318/320), are larger than or equal to the G0-space. The pattern layout 310 thus complies with the feature splitting constraint applied in the preferred direction.

Applying the feature splitting constraint in the non-preferred direction, colors of the beginning and ending routing tracks of each feature 311-321 are evaluated to determine whether any features will require splitting. Features 311, 312, 314, 315, 316, 317, 319, 320, and 321 each correspond with a single routing track of a single color, thus no splitting is required for these features. Feature 313 occupies three routing tracks, routing tracks 302-304, where the beginning routing track 302 and ending routing track 304 are the same color, Color B. Feature 313 will thus not require splitting for pattern decomposition. Feature 318 also occupies three routing tracks, routing tracks 306-308, where the beginning routing track 306 and ending routing track 308 are the same color, Color B. Feature 318 will thus not require splitting. In the depicted embodiment, keepout (pattern-free) regions have been reserved adjacent to the non-minimum width feature portion 313C and the off-grid feature 320. This ensures that the pattern layout 310 will remain compliant with any minimum width or minimum spacing rules, preventing G0-spaces around the non-minimum width feature portion and off-grid feature. The pattern layout 310 thus complies with the feature splitting constraint applied in the non-preferred direction, without having to modify the pattern layout 300 to include stitch insertions.

The features 311-321 are colored based on the color of each feature's corresponding routing track or tracks. Feature 311 corresponds with routing track 301 (designated as a Color A track), so feature 301 is colored Color A. Feature 312 corresponds with routing track 302 (designated as a Color B track), so feature 312 is colored Color B. Feature 313 does not require splitting, so it is designated the color of its corresponding beginning (302) and ending (304) routing tracks, Color B. Features 314 and 315 correspond respectively with routing tracks 303 and 304 (designated respectively as Color A and Color B tracks), so feature 314 and 315 are colored Color A and Color B, respectively. Feature 316 corresponds with routing track 305 (designated as a Color A track), so feature 316 is colored Color A. Feature 317 corresponds with routing track 306 (designated as a Color B track), so feature 317 is colored Color B. Feature 318 does not require splitting, so it is designated the color of its corresponding beginning (306) and ending (308) routing tracks, Color B. Features 319 and 321 correspond respectively with routing tracks 307 and 309 (designated as Color A tracks), so features 319 and 320 are colored Color A. Feature 320 can be colored either Color A or Color B since the keepout regions ensure that no G0-spaces occur around feature 320. In the depicted embodiment, feature 320 is colored Color B. The colored pattern layout 310 may then be decomposed into two masks, where Color A features are formed on one mask and Color B features are formed on another mask. The masks may be used to print an image of the pattern layout 310 into a photoresist layer during integrated circuit device manufacturing.

Thus, the present disclosure provides a routing method that achieves multiple patterning compliant pattern layouts. The multiple patterning compliant pattern layouts can be easily decomposed into multiple masks. The disclosed method balances routing flexibility with stitch usage—maximizing routing flexibility and minimizing stitching usage to the fullest extent possible. By balancing routing flexibility and stitch usage, the disclosed method can reduce cycle time and the current electronic design automation flow. It is understood that different embodiments may have different advantages, and that no particular advantage is necessarily required of any embodiment.

The present disclosure can take the form of an entirely hardware embodiment, an entirely software embodiment, or an embodiment containing both hardware and software elements. In an example, an electronic design automation (EDA) apparatus may implement the method 10 described herein. Furthermore, embodiments of the present disclosure can take the form of a computer program product accessible from a tangible computer-usable or computer-readable medium providing program code for use by or in connection with a computer or any instruction execution system. For the purposes of this description, a tangible computer-usable or computer-readable medium can be any apparatus that can contain, store, communicate, propagate, or transport the program for use by or in connection with the instruction execution system, apparatus, or device. The medium can be an electronic, magnetic, optical, electromagnetic, infrared, a semiconductor system (or apparatus or device), or a propagation medium.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    providing a routing grid having routing tracks;
    designating each of the routing tracks one of at least two colors;
    applying a pattern layout having a plurality of features to the routing grid, wherein each of the plurality of features corresponds with at least one routing track;
    applying, by a computer, a feature splitting constraint to determine whether the pattern layout is a multiple patterning compliant layout, wherein the applying the feature splitting constraint to determine whether the pattern layout is the multiple patterning compliant layout includes determining whether any of the plurality of features begin and end on routing tracks of different colors and designating the pattern layout as not a multiple patterning compliant layout when any of the plurality of features begin and end on routing tracks of different colors;
    if the pattern layout is not a multiple patterning compliant layout, modifying the pattern layout until a multiple patterning compliant layout is achieved; and
    if the pattern layout is a multiple patterning compliant layout, coloring each of the plurality of features based on the color of each feature's corresponding at least one routing track, thereby forming a colored pattern layout, and generating at least two masks with the features of the colored pattern layout, wherein each mask includes features of a single color.

2. The method of claim 1 wherein the designating each of the routing tracks one of at least two colors includes designating routing tracks extending in a preferred direction one of the at least two colors.

3. The method of claim 2 wherein the applying the feature splitting constraint to determine whether the pattern layout is a multiple patterning compliant layout includes determining whether the plurality of features comply with a no splitting constraint.

4. The method of claim 3 wherein:
each of the plurality of features includes at least one feature portion oriented in the preferred direction, feature portion oriented in a non-preferred direction that is perpendicular to the preferred direction, or both; and
the determining whether the plurality of features comply with the no splitting constraint includes:
identifying any feature that includes a feature portion oriented in the non-preferred direction,
determining whether any of the identified features begin and end on routing tracks of different colors, and
if any of the identified features begin and end on routing tracks of different colors, designating the pattern layout as not a multiple patterning compliant layout.

5. The method of claim 4 further including modifying the pattern layout after designating the pattern layout as not a multiple patterning compliant layout, wherein the modifying includes redesigning the pattern layout.

6. The method of claim 2 wherein:
each of the plurality of features includes at least one feature portion oriented in the preferred direction, feature portion oriented in a non-preferred direction that is perpendicular to the preferred direction, or both; and
the applying the feature splitting constraint to determine whether the pattern layout is a multiple patterning compliant layout includes:
applying no feature splitting in the preferred direction, and
applying feature splitting in the non-preferred direction.

7. The method of claim 6 wherein the applying no feature splitting in the preferred direction includes:
determining whether spacing between features in the preferred direction is equal to or greater than a threshold value; and
designating the pattern layout as not a multiple patterning compliant layout if the spacing between features in the preferred direction is less than the threshold value.

8. The method of claim 6 wherein the applying feature splitting in the non-preferred direction includes determining whether any features need splitting.

9. The method of claim 8 wherein:
the preferred routing tracks are designated a first color and a second color, such that every other preferred routing track is either the first color or the second color; and
the determining whether any features need splitting includes identifying any features that do not occupy an odd number of routing tracks.

10. The method of claim 9 further including performing a stitch insertion to any feature that does not occupy an odd number of routing tracks.

11. A method comprising:
providing a routing grid having routing tracks oriented in a preferred direction, wherein each of the routing tracks is designated one of at least two colors;
applying, by a computer, a pattern layout having a plurality of features to the routing grid, wherein each of the plurality of features corresponds with at least one routing track;
determining whether the pattern layout complies with a first feature splitting constraint applied in the preferred direction and a second feature splitting constraint applied in a non-preferred direction that is perpendicular to the preferred direction, wherein the determining whether the pattern layout complies with a second feature splitting constraint applied in a non-preferred direction that is perpendicular to the preferred direction includes determining whether any features having a feature portion oriented in the non-preferred direction begin and end on routing tracks of different colors and designating the pattern layout as not complying with the second feature splitting constraint if any features having a feature portion oriented in the non-preferred direction begin and end on routing tracks of different colors; and
if the pattern layout complies with the first and second feature splitting constraints, coloring each of the plurality of features based on the color of each feature's corresponding at least one routing track, thereby creating a colored pattern layout, and generating at least two masks with the features of the colored pattern layout, wherein each mask includes features of a single color.

12. The method of claim 11 wherein:
each of the plurality of features includes at least one feature portion oriented in the preferred direction, feature portion oriented in the non-preferred direction, or both; and
the determining whether the pattern layout complies with the first feature splitting constraint applied in the preferred direction includes:
checking whether spacing in the preferred direction between any features is less than a threshold value, and
designating the pattern layout as not complying with the first feature splitting constraint if the spacing in the preferred direction between any features is less than the threshold value.

13. The method of claim 12 further including modifying the pattern layout until its pattern layout complies with the first feature splitting constraint if the spacing in the preferred direction between any features is less than the threshold value.

14. The method of claim 11 wherein
each of the plurality of features includes at least one feature portion oriented in the preferred direction, feature portion oriented in the non-preferred direction, or both.

15. The method of claim 14 further including modifying the pattern layout until it complies with the second feature splitting constraint if any features having a feature portion oriented in the non-preferred direction begin and end on routing tracks of different colors.

16. The method of claim 15 wherein the modifying the pattern layout includes performing a stitch insertion to any features having a feature portion oriented in the non-preferred direction that begin and end on routing tracks of different colors.

17. The method of claim 16 wherein the performing the stitch insertion to any feature having a feature portion oriented in the non-preferred direction that begins and ends on routing tracks of different colors includes:
determining whether the feature portion oriented in the non-preferred direction corresponds with a number of routing tracks less than or equal to a routing track manufacturing threshold;
if the number of routing tracks the feature portion oriented in the non-preferred direction corresponds with is less than or equal to the routing track manufacturing threshold, determining whether the feature portion oriented in the non-preferred direction is a line or a line-end; and
determining a maximum stitch overlap length (MSOL) based on whether the feature portion oriented in the non-preferred direction is a line or line-end.

18. The method of claim 17 wherein the determining whether the feature portion oriented in the non-preferred direction is a line or line-end includes determining whether a width of the feature portion is greater than or equal to a line-end width threshold, wherein the feature portion oriented in the non-preferred direction is a line if it is greater than or equal to the line-end width threshold, and the feature portion oriented in the non-preferred direction is a line-end if it is less than the line-end width threshold.

19. The method of claim 18 wherein the determining the MSOL based on whether the feature portion oriented in the non-preferred direction is a line or line-end includes:
   if the feature portion oriented in the non-preferred direction is a line-end, setting the maximum stitch overlap length to be:

$$MSOL = 3P - W/2 - W/2 - 2L$$

where P is a minimum pitch between routing tracks, W is a minimum line width, and L is a minimum spacing between a line and a line end, and
   if the feature portion oriented in the non-preferred direction is a line, setting the maximum overlap length to be:

$$MSOL = 3P - W/2 - W/2 - 2R$$

where R is a minimum spacing between lines (minimum run-run spacing).

20. The method of claim 18 wherein if the feature portion oriented in the non-preferred direction is a line-end:
   reserving at least one feature-free region adjacent to each end of the feature portion oriented in the non-preferred direction; and
   the determining the MSOL includes setting the maximum stitch overlap length to be:

$$MSOL = P + W/2 + W/2$$

where P is a minimum pitch between routing tracks and W is a minimum line width.

21. The method of claim 18 wherein, if the feature portion oriented in the non-preferred direction is a line-end and is a part of a feature that includes a feature portion oriented in the preferred direction, such that the feature portion oriented in the non-preferred direction extends past the feature portion oriented in the preferred direction:
   reserving at least one feature-free region adjacent to each end of the feature portion oriented in the non-preferred direction portion; and
   the determining the MSOL includes setting the maximum stitch overlap length to be:

$$MSOL = 5P - W/2 - W/2 - 2L$$

where P is a minimum pitch between routing tracks, W is a minimum line width, and L is a minimum spacing between a line and a line end.

22. The method of claim 18 wherein, if the feature portion oriented in the non-preferred direction is a line and is a part of a feature that includes a feature portion oriented in the preferred direction, such that the feature portion oriented in the non-preferred direction extends past the feature portion oriented in the preferred direction:
   reserving at least one feature-free region adjacent to each end of the feature portion oriented in the non-preferred direction portion; and
   the determining the MSOL includes setting the maximum stitch overlap length to be:

$$MSOL = 5P - W/2 - W/2 - 2R$$

where P is a minimum pitch between routing tracks, W is a minimum line width, and L is a minimum spacing between lines (minimum run-run spacing).

23. The method of claim 15 wherein the modifying the pattern layout includes redesigning the pattern layout.

24. The method of claim 11 wherein the providing the routing grid having routing tracks oriented in a preferred direction, wherein each of the routing tracks is designated one of at least two colors includes designating routing tracks extending in the preferred direction one of a first color and a second color, such that every other routing track is one of the first color and the second color.

25. The method of claim 24 wherein:
   each of the plurality of features includes at least one feature portion oriented in the preferred direction, feature portion oriented in the non-preferred direction, or both; and
   the determining whether the pattern layout complies with the second feature splitting constraint applied in the non-preferred direction includes:
      determining if any features having a feature portion oriented in the non-preferred direction occupy an even number of routing tracks, and
      performing a stitch insertion to any features having a feature portion oriented in the non-preferred direction that occupy an even number of routing tracks.

26. The method of claim 11 further including reserving at least one feature-free region adjacent to any feature that does not correspond with at least one routing track.

27. The method of claim 11:
   wherein each of the plurality of features includes at least one feature portion oriented in the preferred direction, feature portion oriented in the non-preferred direction, or both; and
   further including reserving at least one feature-free region adjacent to any feature portion that is a non-minimum width.

28. An apparatus comprising:
   a computer readable medium that stores a plurality of instructions for execution by at least one computer processor, wherein the instructions are for:
      providing a routing grid having routing tracks;
      designating each of the routing tracks one of at least two colors;
      applying a pattern layout having a plurality of features to the routing grid, wherein each of the plurality of features corresponds with at least one routing track;
      applying a feature splitting constraint to determine whether the pattern layout is a multiple patterning compliant layout, wherein the applying the feature splitting constraint to determine whether the pattern layout is the multiple patterning compliant layout includes determining whether any of the plurality of features begin and end on routing tracks of different colors and designating the pattern layout as not a multiple patterning compliant layout when any of the plurality of features begin and end on routing tracks of different colors;
      if the pattern layout is not a multiple patterning compliant layout, modifying the pattern layout until a multiple patterning compliant layout is achieved; and
      if the pattern layout is a multiple patterning compliant layout, coloring each of the plurality of features based on the color of each feature's corresponding at least one routing track, thereby forming a colored pattern layout, and generating at least two masks with the features of the colored pattern layout, wherein each mask includes features of a single color.

* * * * *